United States Patent [19]

Papamichalis

[11] Patent Number: 4,718,087
[45] Date of Patent: Jan. 5, 1988

[54] METHOD AND SYSTEM FOR ENCODING DIGITAL SPEECH INFORMATION

[75] Inventor: Panagiotis E. Papamichalis, Richardson, Tex.

[73] Assignee: Texas Instruments Incorporated, Dallas, Tex.

[21] Appl. No.: 609,155

[22] Filed: May 11, 1984

[51] Int. Cl.$^4$ .............................................. G10L 5/00
[52] U.S. Cl. ........................................ 381/34; 381/31
[58] Field of Search ............................ 381/34, 51, 31; 358/261

[56] References Cited

U.S. PATENT DOCUMENTS

| | | | |
|---|---|---|---|
| 4,463,386 | 7/1984 | Goddard et al. | 358/261 |
| 4,489,437 | 12/1984 | Fukuichi et al. | 381/51 |
| 4,534,055 | 8/1985 | Iinuma | 381/34 |

OTHER PUBLICATIONS

"Variable-to-Fixed Rate Conversion of Narrowband LPC Speech"—Blackman et al., *Proceedings of the 1977 IEEE International Conference on Acoustics, Speech, and Signal Processing*, pp. 409–412 (1977).
"Probability, Random Variables, and Stochastic Processes"—Papoulis, *McGraw-Hill Book Company*, New York, pp. 528–551 (1965).
"Information Theory and Reliable Communication'—Gallager, *John Wiley & Sons, Inc.*, New York, pp. 52–55 (1968).

Primary Examiner—Emanuel S. Kemeny
Attorney, Agent, or Firm—William E. Hiller; N. Rhys Merrett; Melvin Sharp

[57] ABSTRACT

Method and system for encoding digital speech information to characterize spoken human speech with an optimally reduced speech data rate while retaining speech quality in the audible reproduction of the encoded digital speech information. Markov modeling is applied to quantized speech parameters to represent their time behavior in a probabilistic manner. This is accomplished by representing the quantized speech parameters as finite state machines having predetermined matrices of transitional probabilities from which the conditional probabilities as to the quantized speech parameter values of successive speech data frames are established. The probabilistic description as so obtained is then used to represent the respective quantized values of the speech parameters by a digital code through Huffman coding in which digital codewords of variable length represent the quantized speech parameter values in accordance with their probability of occurrence such that more probable quantized values are assigned digital codewords of a shorter bit length while less probable quantized values are assigned digital codewords of a longer bit length.

18 Claims, 7 Drawing Figures

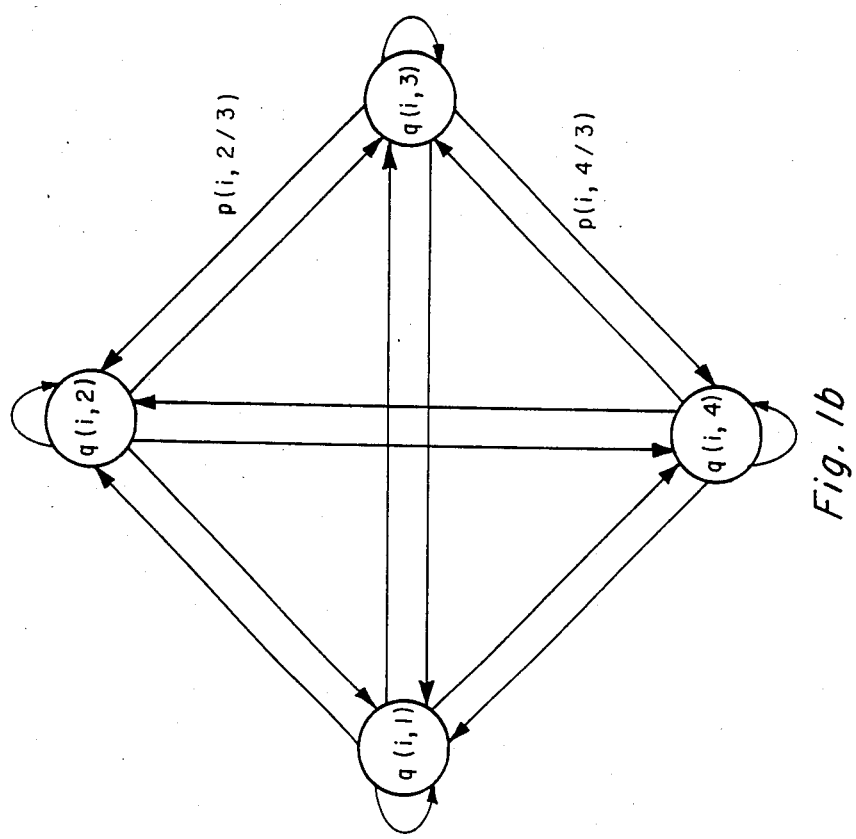
Fig. 1b
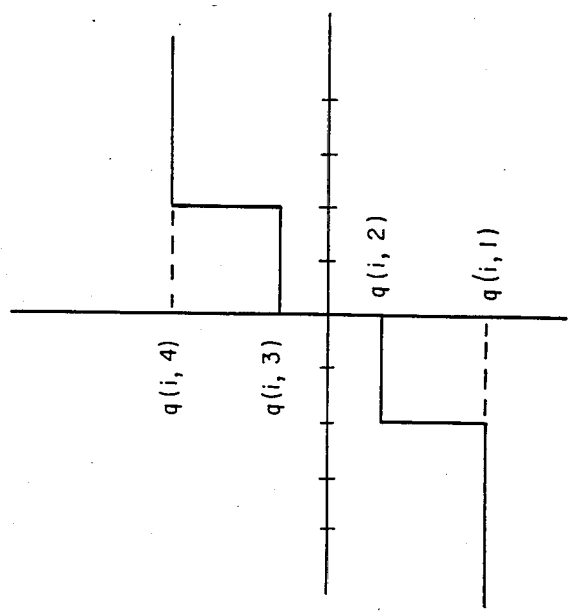
Fig. 1a
$$\begin{bmatrix} p(i,1/1) & p(i,2/1) & p(i,3/1) & p(i,4/1) \\ p(i,1/2) & p(i,2/2) & p(i,3/2) & p(i,4/2) \\ p(i,1/3) & p(i,2/3) & p(i,3/3) & p(i,4/3) \\ p(i,1/4) & p(i,2/4) & p(i,3/4) & p(i,4/4) \end{bmatrix}$$
Fig. 1c

METHOD AND SYSTEM FOR ENCODING DIGITAL SPEECH INFORMATION

BACKGROUND OF THE INVENTION

The present invention generally relates to a method and system of encoding digital speech information so as to achieve an economical representation of speech with the least possible loss of quality, thereby providing speech transmission in a vocoder-type system or simply a speech synthesis system with a reduced bit rate while retaining speech quality in the audible reproduction of the encoded digital speech information. More particularly, the present invention is directed to a method and system employing Markov modeling and Huffman coding on quantized speech parameter values, wherein the speech parameter values may be indicative of linear predictive coding pitch, energy and reflection coefficients, to improve the coding efficiency by providing an optimal reduction in the speech data rate while the speech quality in the audible reproduction of the speech data remains unaffected.

Linear predictive coding (LPC) is a well known method of digitally coding speech information in widespread use in vocoder and speech synthesis systems from which audible synthesized speech can be reproduced. LPC is based upon the recognition that in speech, sound patterns constituting the speech tend to be relatively consistent for long periods of time. A typical frame of speech that has been encoded in digital form using linear predictive coding will have a specified allocation of binary digits to describe the gain, the pitch and each of ten reflection coefficients characterizing the lattice filter equivalent of the vocal tract in a speech synthesis system. The use of ten reflection coefficients as speech parameters in the analysis and synthesis of speech is arbitrary. In the latter connection, the adding of more reflection coefficients also increases the memory storage requirements of the system, along with the fact that each additional reflection coefficient is of progressively less significance in contributing to audible speech quality than the preceding reflection coefficient. Thus, the use of ten reflection coefficients as speech parameters may be generally regarded as a satisfactory number to achieve high quality speech via a linear predictive coding without unnecesarily adding to the memory storage requirements. Although the inclusion of more reflection coefficients as speech parameters would provide a marginal improvement in the quality of audible speech to be derived therefrom, the actual detectable difference in the resulting audible speech is for practical purposes unnoticeable. Furthermore, it is possible to achieve adequate speech quality using a linear predictive coding technique where the number of reflection coefficients defining speech parameters is less than ten, e.g. such as eight or even a lower number of reflection coefficients.

Systems for linear predictive coding as heretofore contemplated have included different frame lengths and bit allocation, such as that described in U.S. Pat. No. 4,209,836 Wiggins, Jr. et al issued June 24, 1980 which assigns differing bit lengths for the respective speech parameters including gain, pitch and the ten reflection coefficients described therein. The use of ten reflection coefficients as speech parameters in a speech analysis and/or speech synthesis system relying upon linear predictive coding produces audible speech of excellent quality. It would be desirable to retain the same degree of speech quality in such a speech analysis and/or speech synthesis system by retaining the same number of reflection coefficients as speech parameters with the same quantization levels, but at a reduced bit rate.

Heretofore, such an effort to reduce the data rate for speech in a vocoder system without a proportional deterioration of the speech quality has been concentrated on the choice of the appropriate speech parameters. In this connection, attempts have been made to select the speech parameters for coding which are most closely associated with human perception, with the less relevant speech parameter information being discarded so as to achieve effective low bit rate coding. Where a vocoder is involved, such attempts are directed to adequately represent the speech spectral envelope representing the vocal tract filter and to represent the filter excitation and energy with the lowest possible speech parameter information necessary to provide audible speech of reasonable quality. This approach results in a static representation of the speech production model which ignores the dynamic evolution of the speech waveform and causes deterioration in the speech quality to be achieved therefrom.

Some attempts have been made to capitalize upon the dynamic behavior of speech. One such technique of reducing the data rate for speech is referred to as variable-frame-rate (VFR) coding as described in "Variable-to-Fixed Rate Conversion of Narrowband LPC Speech"—Blackman et al, *Proceedings of the 1977 IEEE International Conference on Acoustics, Speech, and Signal Processing*. In so-called VFR coding, a first number of reflection coefficients, e.g. four reflection coefficients, is examined every frame time. If none of this first number of reflection coefficients has a different quantized value, no information is transmitted for that frame. If any one of the number of reflection coefficients has a change in quantized value from the last transmitted frame, then all of the speech parameters are transmitted for that frame. Thus, all or none of the LPC coefficients are transmitted at each frame time. Since in some frames, no data is transmitted, the result is a reduction in the data rate. While techniques such as this have achieved some positive results in an effective reduction in the data rate without unduly penalizing the quality of the speech to be obtained, further reductions in speech data rate without accompanying degradation of speech quality have not been forthcoming from this approach which may be described as a deterministic modeling of the time behavior of speech.

SUMMARY OF THE INVENTION

In accordance with the present invention, a statistical approach is chosen as a means of reducing the speech data rate, where a Markov model is relied upon to represent the behavior of the speech parameters of interest. Markov modeling is generally described in the publication, "Probability, Random Variables, and Stochastic Processes"—Papoulis, *McGraw-Hill Book Company*, New York (1965) on pages 528–551. In Markov modeling, the speech parameters are essentially represented by finite state machines with certain matrices of transitional probabilities. The time dimension is captured in the transitional probabilities of the speech parameters from one frame to the next successive frame.

The present invention contemplates the unique combining of Markov modeling with a technique known as Huffman coding as a means of achieving a worthwhile reduction in the data rate of coded speech parameters, such as the linear predictive coding of reflection coefficients. Huffman coding is a well known technique of source coding from information theory and is generally described in the publication, "Information Theory and Reliable Communication"—Gallager, *John Wiley and Sons, Inc.,* New York (1968) on pages 52-55. Huffman coding is directed toward the finding of an optimum set of codewords to represent a given set of messages such that no other uniquely decodable set of codewords has a smaller average codeword length than the given set.

In its basic approach, the present invention concerns a method and system of endoding digital speech information to characterize spoken human speech with an optimally reduced speech data rate while retaining speech quality in the audible reproduction of the encoded digital speech information in which Markov modeling is uniquely combined with Huffman coding in a manner achieving a highly efficient coding of speech parameters, such as linear predictive coding energy, pitch and reflection coefficients. Thus, the present method operates upon quantized speech parameter values in determining the transition probabilities for corresponding quantized speech parameter values from one speech frame to the next speech frame, establishing the conditional probabilities as to the quantized values of the speech parameters of successive speech data frames as based upon the determination of the transition probabilities, and thereafter representing the respective quantized values of the speech parameters after the conditional probabilities have been established by a digital code in which digital codewords of variable length represent the quantized values in accordance with their probability of occurrence such that more probable quantized values are assigned digital codewords of a shorter bit length while less probable quantized values are assigned digital codewords of a longer bit length. The latter assignment of codewords is the application of Huffman coding to Markov modeling in the specific aspect of the method and system in accordance with the present invention.

Since this method and system operate only on the speech parameters after they have been quantized, rather than operating upon unprocessed speech parameters, there is no effect on speech quality because the method and system operate in a post-processing chronology on already quantized speech parameters and have as their purpose the most efficient representation in coded form of these quantized speech parameters.

In a more specific aspect of the method and system according to the present invention, the finite state machines which represent the quantized speech parameters have predetermined matrices of columns and rows of transitional probabilities from which the transition probabilities for the corresponding quantized speech parameter values of the current and at least the next successive speech data frame are determined, wherein the transitional probabilities matrices of the same dimensions may be combined to provide a super matrix, thereby resulting in a desirable reduction in the memory storage requirements imposed by the method and system. A second specific aspect as an alternative approach to the previously described super matrix, proposes condensing each of the predetermined matrices of columns and rows of transitional probabilities to a single super row of transitional probabilities indicative of the respective matrix corresponding thereto, and shifting the super row of transitional probabilities in increments of one position in either direction to generate the conditional probability distribution of additional rows of transitional probabilities for the specific matrix corresponding to the super row. This approach also effects a desired reduction in memory storage requirements imposed by the method and system and is a preferred embodiment of the method which leads to a reduction on the order of 23% in the data bit rate achievable by the method and system according to the present invention.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, when read in conjunction with the accompanying drawings wherein:

FIG. 1a is a graphical representation of a multi-level speech parameter quantization;

FIG. 1b is a schematic representation of the speech parameter quantization showing of FIG. 1a as a finite state machine;

FIG. 1c illustrates a transitional probabilities matrix corresponding to the finite state machine representing a speech parameter quantization as shown in FIG. 1b;

DETAILED DESCRIPTION OF THE INVENTION

Figure 2:
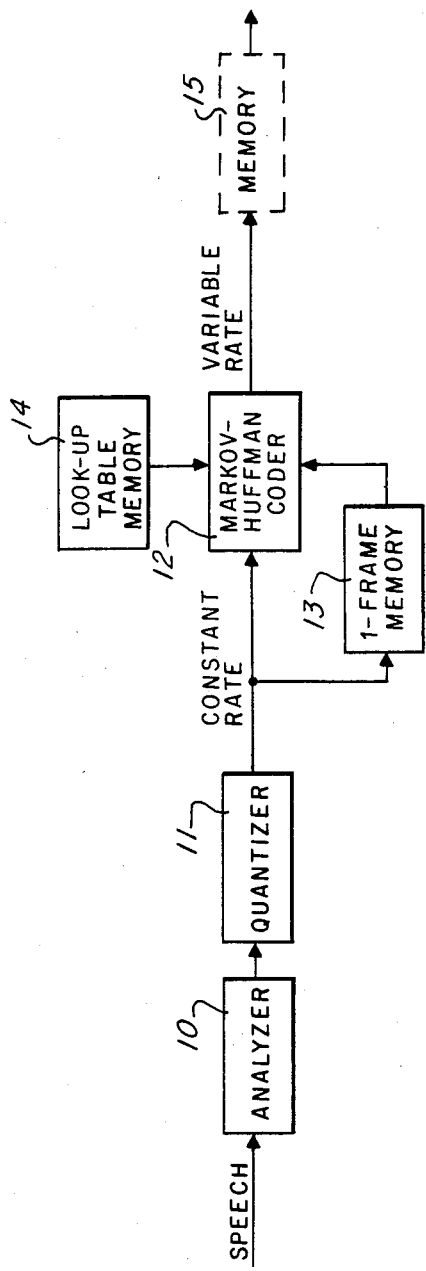
FIG. 2 is a functional block diagram of a speech analysis system equipped with speech parameter encoding as constructed in accordance with the present invention.

In accordance with the present invention, the method of encoding digital speech information relies initially upon Markov modeling of the speech parameters, with each parameter being represented as a finite state machine, where the states are the different quantization levels. If b(j) bits, for example, are assigned for the j-th speech parameter, there are $2^{b(j)}$ possible states. When a parameter is quantized, it is represented by one of these states q(j,i), where j is the index for the parameter and i is the index of the state. In the next speech data frame, the j-th parameter is quantized to some level k, and it is represented by the state q(j,k). The new state can be any of the $2^{b(j)}$ possible states, but certain of them are more probable than others. FIG. 1a shows the regular representation of the quantizer, and FIG. 1b shows a representation as a finite state machine. From the regular representation, it may be observed that the quantization levels are ordered such that there is some sense of adjacency between the states. Because of the smooth variation of the speech parameters, the quantized parameter has a tendency to jump more often to adjacent states than to states further away as the current speech frame is succeeded by the next speech frame during the processing of digital speech data. This frequency of transition is represented by the transition probabilities p(j,i/k) and the corresponding transition probability matrix, as shown in FIG. 1c. The notation p(j,i/k) is the probability of the j-th parameter reaching state i, given that the parameter was in state k in the previous frame.

In the example of FIG. 1, it is assumed that the transition probabilities depend only on the state of the parameter in the previous frame, i.e. a first order Markov model is assumed. In the most general case of a k-th order model, the transition probabilities would be of the form $p(j,i/i_1, \ldots, i_k)$. This is the probability that the j-th parameter of the n-th frame is quantized at the i-th quantization level, given that it was quantized at the $i_1$ level for the n-1 frame, $i_2$ level for the n-2 frame, ..., $i_k$ level for the n-k frame. For convenience, the subsequent analysis will be carried out for the first and second order Markov model.

The effects of adjacency between the states of quantization levels of corresponding speech parameters in successive frames of speech data have been investigated by determining the transition probabilities from computations carried out on a large data base of speech data as hereinafter described. Table I shows the transition probability matrix $\{p(4,i/j), 1 \leq i,j \leq 2^{b(4)}=16\}$, i.e. the probability matrix for the second reflection coefficient K2, and for the first order Markov model, assuming that K2 is quantized to 16 levels.

The j-th row gives the conditional probabilities (in %) that K2 will be quantized to the i-th level, $1 \leq i \leq 16$, given that it was quantized at the j-th level in the previous frame. It will be observed from Table I that the adjacent states are preferred, and each conditional probability has a distribution centered around the diagonal element. In accordance with the present invention, it has been determined that this probabilistic behavior may be used to advantage for achieving a worthwhile data reduction in the speech data rate by employing Huffman coding in conjunction therewith.

Huffman coding is a scheme used to represent a set of quantities which are described by certain probabilities of occurrence. This scheme assigns codewords of variable length to the quantities in accordance with their probability. So, more probable quantities are assigned shorter codewords, while less probable quantities are assigned longer codewords. The assignment is done with respect to the quantization levels of the speech parameters in the present instance so that on the average the least possible bit rate may be achieved. The construction of the codewords is done in a way which guarantees that there will be no ambiguity between the codewords in decoding.

In the present instance, Huffman coding is applied to every row of the transition probability matrix, where the probabilities used for coding are the conditional probabilities referred to previously. Table II gives the codeword lengths of such a scheme corresponding to the transition matrix of Table I, while Table III shows an example of the actual codewords for the eighth row of the matrix.

TABLE I

Transition probability matrix for K2. In a constant bit rate system, K2 is assigned 4 bits for this example.

| | | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|---|
| i | 1 | 35 | 14 | 9 | 6 | 5 | 5 | 5 | 5 | 4 | 3 | 2 | 2 | 2 | 1 | 1 | 1 |
|   | 2 | 15 | 23 | 16 | 10 | 8 | 6 | 5 | 4 | 3 | 2 | 2 | 1 | 1 | 1 | 1 | 1 |
|   | 3 | 7 | 14 | 22 | 17 | 11 | 7 | 5 | 4 | 3 | 2 | 2 | 2 | 1 | 1 | 1 | 0 |
|   | 4 | 4 | 8 | 15 | 21 | 16 | 11 | 7 | 5 | 3 | 2 | 2 | 1 | 1 | 1 | 1 | 0 |
|   | 5 | 3 | 5 | 8 | 15 | 21 | 16 | 11 | 7 | 5 | 3 | 2 | 1 | 1 | 1 | 1 | 0 |
|   | 6 | 2 | 3 | 5 | 9 | 16 | 20 | 17 | 11 | 7 | 4 | 3 | 2 | 1 | 1 | 1 | 0 |
|   | 7 | 1 | 2 | 3 | 5 | 10 | 16 | 19 | 16 | 10 | 6 | 4 | 2 | 2 | 1 | 1 | 0 |
|   | 8 | 1 | 2 | 3 | 4 | 6 | 11 | 16 | 20 | 15 | 10 | 5 | 3 | 2 | 1 | 1 | 0 |
|   | 9 | 1 | 1 | 2 | 3 | 4 | 7 | 12 | 16 | 19 | 15 | 9 | 5 | 3 | 2 | 1 | 1 |
|   | 10 | 1 | 1 | 1 | 2 | 3 | 5 | 7 | 12 | 17 | 19 | 16 | 9 | 5 | 2 | 1 | 1 |
|   | 11 | 1 | 1 | 1 | 2 | 2 | 3 | 4 | 7 | 11 | 17 | 21 | 16 | 9 | 4 | 2 | 1 |
|   | 12 | 1 | 1 | 1 | 1 | 2 | 2 | 3 | 4 | 7 | 11 | 17 | 23 | 16 | 8 | 3 | 1 |
|   | 13 | 1 | 1 | 1 | 1 | 1 | 1 | 2 | 3 | 4 | 6 | 11 | 19 | 25 | 18 | 6 | 2 |
|   | 14 | 0 | 1 | 1 | 1 | 1 | 1 | 1 | 2 | 3 | 3 | 6 | 11 | 20 | 29 | 16 | 5 |
|   | 15 | 0 | 0 | 1 | 1 | 1 | 1 | 1 | 1 | 2 | 2 | 4 | 5 | 10 | 22 | 34 | 16 |
|   | 16 | 0 | 0 | 0 | 1 | 1 | 1 | 1 | 1 | 1 | 2 | 2 | 3 | 4 | 10 | 21 | 53 |

TABLE II

Matrix of the Huffman codeword lengths corresponding to Table I. When K2 is encoded at the j-th level at frame n, the j-th row of codewords is used to represent the coding levels at frame n + 1.

| | | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|---|
| i | 1 | 2 | 3 | 3 | 4 | 4 | 4 | 4 | 4 | 4 | 5 | 5 | 6 | 6 | 6 | 7 | 7 |
|   | 2 | 3 | 2 | 3 | 3 | 4 | 4 | 4 | 4 | 5 | 6 | 6 | 6 | 6 | 6 | 7 | 7 |
|   | 3 | 4 | 3 | 2 | 3 | 3 | 4 | 4 | 4 | 5 | 5 | 6 | 6 | 6 | 7 | 8 | 8 |
|   | 4 | 4 | 4 | 3 | 2 | 3 | 3 | 4 | 4 | 5 | 5 | 6 | 6 | 7 | 7 | 7 | 7 |
|   | 5 | 5 | 4 | 4 | 3 | 2 | 3 | 3 | 4 | 4 | 5 | 6 | 6 | 6 | 7 | 8 | 8 |
|   | 6 | 6 | 5 | 4 | 4 | 3 | 2 | 3 | 3 | 4 | 4 | 5 | 6 | 6 | 7 | 8 | 8 |
|   | 7 | 7 | 6 | 5 | 4 | 3 | 3 | 2 | 3 | 3 | 4 | 5 | 6 | 7 | 7 | 8 | 8 |
|   | 8 | 7 | 6 | 5 | 5 | 4 | 3 | 3 | 2 | 3 | 3 | 5 | 5 | 6 | 6 | 8 | 8 |
|   | 9 | 7 | 7 | 6 | 5 | 4 | 4 | 3 | 3 | 2 | 3 | 4 | 4 | 5 | 6 | 7 | 7 |
|   | 10 | 7 | 7 | 6 | 6 | 5 | 4 | 4 | 3 | 3 | 2 | 3 | 4 | 4 | 5 | 7 | 7 |
|   | 11 | 7 | 6 | 6 | 6 | 6 | 5 | 5 | 4 | 3 | 3 | 2 | 3 | 3 | 5 | 6 | 7 |
|   | 12 | 7 | 7 | 7 | 7 | 6 | 5 | 5 | 5 | 4 | 3 | 3 | 2 | 2 | 3 | 5 | 6 |
|   | 13 | 8 | 8 | 7 | 7 | 7 | 6 | 6 | 6 | 5 | 4 | 3 | 2 | 2 | 3 | 4 | 6 |

TABLE II-continued

Matrix of the Huffman codeword lengths corresponding
to Table I. When K2 is encoded at the j-th level at frame n,
the j-th row of codewords is used to represent the coding
levels at frame n + 1.

| 14 | 7 | 7 | 7 | 7 | 6 | 6 | 6 | 6 | 5 | 5 | 4 | 3 | 2 | 2 | 3 | 5 |
| 15 | 8 | 8 | 7 | 7 | 7 | 6 | 6 | 6 | 6 | 5 | 4 | 4 | 3 | 2 | 2 | 3 |
| 16 | 9 | 8 | 9 | 8 | 7 | 8 | 7 | 7 | 7 | 6 | 6 | 6 | 5 | 3 | 2 | 1 |

TABLE III

Example of Huffman coding. The codewords
correspond to the eighth row of Tables I and II.

| 1 | 1111011 |
| 2 | 100011 |
| 3 | 10000 |
| 4 | 11101 |
| 5 | 1001 |
| 6 | 011 |
| 7 | 110 |
| 8 | 00 |
| 9 | 101 |
| 10 | 010 |
| 11 | 11111 |
| 12 | 11100 |
| 13 | 111100 |
| 14 | 100010 |
| 15 | 11110101 |
| 16 | 11110100 |

From Table II, it can be seen that the elements around the diagonal are represented by shorter codewords since they have higher probability of occurrence. Table III shows that the codewords are uniquely decodable, i.e. no codeword is the first part of any other codeword, and, hence when a stream of bits completes a codeword that codeword is immediately recognized. For the application of the Huffman coding scheme, when the j-th parameter of the n-th frame is coded at the k-th level, the representation of the j-th parameter at the n+1 frame is done using the codewords corresponding to the k-th row of the transition matrix.

From the application of the method of encoding digital speech information as hereinbefore described, a speech analysis and/or synthesis system of variable bit rate may be implemented for which the average bit rate, or the average frame length in bits can be computed. Let $l(j,i/i_1,i_2)$ be the length of the i-th codeword in the table which is constructed based on the conditional probabilities $p(j,i/i_1,i_2)$. For example Table I gives the lengths $l(4,i/k)$. Then, the average codeword length of the j-th parameter in the second order Markov model is given by:

$$L(j) = \sum_{i_2=1}^{2^{b(j)}} \sum_{i_1=1}^{2^{b(j)}} \left[ \sum_{i=1}^{2^{b(j)}} l(j, i/i_1, i_2)p(j, i/i_1, i_2) \right] p(j/i_1, i_2)$$

The average length per frame, L, is the sum of L(j) over all j.

These are the predicted statistical averages. The actual averages obtained by processing some speech information, as indicated by the subscript a, are derived as follows. Let $n(j,i/i_1,i_2)$ be the actual number of times that speech parameter j was encoded at the i-th level, given that in the previous two frames it had been encoded at the levels $i_1$ and $i_2$. Then define:

$$n(j/i_1, i_2) = \sum_{i=1}^{2^{b(j)}} n(j, i/i_1, i_2)$$

$$n_t = \sum_{i_1=1}^{2^{b(j)}} \sum_{i_2=1}^{2^{b(j)}} n(j/i_1, i_2)$$

$$p_a(j, i/i_1, i_2) = n(j, i/i_1, i_2)/n(j/i_1, i_2)$$

$$p_a(j/i_1, i_2) = n(j/i_1, i_2)/n_t(j)$$

Then, $$L_a(j) = \sum_{i_2=1}^{2^{b(j)}} \sum_{i_1=1}^{2^{b(j)}} \left[ \sum_{i=1}^{2^{b(j)}} l(j, i/i_1, i_2)p_a(j, i/i_1, i_2) \right] p_a(j/i_1, i_2)$$

and $L_a$ is the total actual average bits per frame, i.e. the sum of $L_a(j)$ over all j.

The above described method of encoding digital speech data, as unmodified, has a relatively large storage requirement in order to accommodate the matrices containing the Huffman codewords. For instance, the order of magnitude of the storage required for the first order Markov model is given by the nuymber of codewords in the whole table, as follows. Let b(j) be the number of bits assigned to the j-th parameter, $1 \leq j \leq p+2$, where p is the order of the LPC model. Then the total number of codewords required is $$S_1 = \sum_{j=1}^{p+2} 2^{2b(j)}$$

For the second order Markov model, the corresponding storage requirement is $$S_2 = \sum_{j=1}^{p+2} 2^{3b(j)}$$

As an example, consider the bit assignment of Table IV.

TABLE IV

Bit assignment for an LPC-10 system with 48 bits per frame.

| Parameter | Bits |
|---|---|
| Energy | 5 |
| Pitch | 5 |
| K1 | 5 |
| K2 | 4 |
| K3 | 4 |
| K4 | 4 |
| K5 | 4 |
| K6 | 4 |
| K7 | 4 |
| K8 | 4 |
| K9 | 3 |
| K10 | 2 |

In this case, $S_1 = 4944$, and $S_2 = 127552$ codewords.

The storage requirements may be reduced in accordance with either of two additional coding procedures. In the first one, the storage reduction is achieved by combining coding matrices of the same size. Since the matrices are created from the actual number of transitions n(j,i/k) which take place in the large data base used for the computation of the matrices, the combination of matrices is done as follows. For every set of matrices [j₁, ..., jₘ] which have the same dimensions, a "supermatrix", s, is created with $$n(s, i/k) = \sum_{r=1}^{m} n(j_r, i/k)$$

Then, based on this absolute frequency of occurrence, the transition probabilities are computed and, from them, the Huffman codewords. Table V shows the matrix with the Huffman codeword lengths corresponding to the combination of the transition probability matrices for the parameters K2-K8 in the example of Table IV.

previous row, but it is shifted by one position. As a result, the codeword lengths corresponding to each row are substantially similar to the ones in the adjacent rows if they are shifted by one position (see Table II). To implement this observation, a "super-row" is created for each matrix. This "super-row" is constructed around the middle row $2^{b(j)-1}$ of the matrix, and it has absolute frequencies of occurrence n(j,i) given by $$n(j, i) = \sum_{K=-2^{b(j)-1}}^{2^{b(j)-1}-1} n(j, (i-k)/(2^{b(j)-1}-k))$$

where it is assumed that $n(j,i/i_1)=0$ for $i \leq 0$ or $i \geq 2^{b(j)}$. From these frequencies, the corresponding probabilities are computed which are then used to generate the Huffman codewords. The rest of the rows of the matrices are generated from the super-row by circular shifting as shown in Table VI which corresponds to the matrix of parameter K2 of Table I.

TABLE VI

Matrix of the Huffman codeword lengths corresponding to the transition probability matrix for K2 which is generated from a super-row.

|   | j |   |   |   |   |   |   |   |   |   |   |   |   |   |   |   |
|---|---|---|---|---|---|---|---|---|---|---|---|---|---|---|---|---|
| i | 1 | 2 | 3 | 4 | 5 | 6 | 7 | 8 | 9 | 10 | 11 | 12 | 13 | 14 | 15 | 16 |
| 1 | 2 | 3 | 4 | 4 | 5 | 5 | 5 | 5 | 5 | 6 | 6 | 5 | 5 | 4 | 4 | 3 |
| 2 | 3 | 2 | 3 | 4 | 4 | 5 | 5 | 5 | 5 | 5 | 6 | 6 | 5 | 5 | 4 | 4 |
| 3 | 4 | 3 | 2 | 3 | 4 | 4 | 5 | 5 | 5 | 5 | 5 | 6 | 6 | 5 | 5 | 4 |
| 4 | 4 | 4 | 3 | 2 | 3 | 4 | 4 | 5 | 5 | 5 | 5 | 5 | 6 | 6 | 5 | 5 |
| 5 | 5 | 4 | 4 | 3 | 2 | 3 | 4 | 4 | 5 | 5 | 5 | 5 | 5 | 6 | 6 | 5 |
| 6 | 5 | 5 | 4 | 4 | 3 | 2 | 3 | 4 | 4 | 5 | 5 | 5 | 5 | 5 | 6 | 6 |
| 7 | 6 | 5 | 5 | 4 | 4 | 3 | 2 | 3 | 4 | 4 | 5 | 5 | 5 | 5 | 5 | 6 |
| 8 | 6 | 6 | 5 | 5 | 4 | 4 | 3 | 2 | 3 | 4 | 4 | 5 | 5 | 5 | 5 | 5 |
| 9 | 5 | 6 | 6 | 5 | 5 | 4 | 4 | 3 | 2 | 3 | 4 | 4 | 5 | 5 | 5 | 5 |
| 10 | 5 | 5 | 6 | 6 | 5 | 5 | 4 | 4 | 3 | 2 | 3 | 4 | 4 | 5 | 5 | 5 |
| 11 | 5 | 5 | 5 | 6 | 6 | 5 | 5 | 4 | 4 | 3 | 2 | 3 | 4 | 4 | 5 | 5 |
| 12 | 5 | 5 | 5 | 5 | 6 | 6 | 5 | 5 | 4 | 4 | 3 | 2 | 3 | 4 | 4 | 5 |
| 13 | 5 | 5 | 5 | 5 | 5 | 6 | 6 | 5 | 5 | 4 | 4 | 3 | 2 | 3 | 4 | 4 |
| 14 | 4 | 5 | 5 | 5 | 5 | 5 | 6 | 6 | 5 | 5 | 4 | 4 | 3 | 2 | 3 | 4 |
| 15 | 4 | 4 | 5 | 5 | 5 | 5 | 5 | 6 | 6 | 5 | 5 | 4 | 4 | 3 | 2 | 3 |
| 16 | 3 | 4 | 4 | 5 | 5 | 5 | 5 | 5 | 6 | 6 | 5 | 5 | 4 | 4 | 3 | 2 |

TABLE V

|   | j |   |   |   |   |   |   |   |   |   |   |   |   |   |   |   |
|---|---|---|---|---|---|---|---|---|---|---|---|---|---|---|---|---|
| i | 1 | 2 | 3 | 4 | 5 | 6 | 7 | 8 | 9 | 10 | 11 | 12 | 13 | 14 | 15 | 16 |
| 1 | 3 | 5 | 5 | 5 | 5 | 5 | 4 | 3 | 4 | 5 | 5 | 5 | 5 | 5 | 4 | 2 |
| 2 | 2 | 2 | 3 | 4 | 4 | 5 | 5 | 4 | 5 | 5 | 6 | 6 | 7 | 7 | 7 | 7 |
| 3 | 3 | 4 | 4 | 4 | 5 | 5 | 5 | 4 | 2 | 4 | 5 | 5 | 5 | 5 | 5 | 4 |
| 4 | 2 | 3 | 3 | 3 | 3 | 4 | 4 | 5 | 5 | 6 | 6 | 7 | 7 | 7 | 8 | 8 |
| 5 | 4 | 5 | 4 | 4 | 4 | 4 | 4 | 4 | 4 | 2 | 4 | 5 | 5 | 5 | 5 | 5 |
| 6 | 4 | 2 | 3 | 4 | 3 | 3 | 4 | 4 | 5 | 5 | 5 | 6 | 7 | 8 | 9 | 9 |
| 7 | 4 | 5 | 5 | 5 | 4 | 4 | 3 | 4 | 4 | 4 | 2 | 4 | 5 | 5 | 6 | 6 |
| 8 | 5 | 4 | 2 | 3 | 4 | 4 | 4 | 3 | 4 | 4 | 5 | 5 | 6 | 7 | 8 | 8 |
| 9 | 4 | 6 | 6 | 5 | 5 | 5 | 4 | 4 | 3 | 4 | 4 | 2 | 3 | 5 | 6 | 6 |
| 10 | 5 | 5 | 4 | 2 | 3 | 4 | 4 | 4 | 4 | 4 | 4 | 4 | 5 | 6 | 7 | 7 |
| 11 | 4 | 6 | 6 | 5 | 5 | 5 | 5 | 5 | 4 | 4 | 3 | 3 | 2 | 4 | 5 | 5 |
| 12 | 5 | 5 | 5 | 4 | 2 | 3 | 5 | 5 | 5 | 4 | 4 | 3 | 4 | 5 | 6 | 6 |
| 13 | 4 | 7 | 7 | 6 | 5 | 5 | 5 | 5 | 5 | 5 | 4 | 3 | 3 | 2 | 3 | 5 |
| 14 | 5 | 5 | 5 | 4 | 3 | 3 | 4 | 5 | 5 | 5 | 5 | 4 | 3 | 3 | 4 | 5 |
| 15 | 5 | 7 | 7 | 6 | 5 | 4 | 4 | 4 | 5 | 5 | 5 | 4 | 4 | 3 | 2 | 3 |
| 16 | 4 | 5 | 5 | 5 | 4 | 3 | 3 | 4 | 5 | 5 | 6 | 6 | 5 | 5 | 4 | 2 |

All the examples shown use the first order Markov model. The storage requirement in terms of codewords is now reduced to S₁=1360 codewords for the case of Table IV.

In the second procedure, every matrix of codewords is condensed to a single row. In this connection, it was observed that each transition probability matrix has a form similar to that of Table I, i.e. the conditional probability distribution of each row looks very much like the By employing this procedure, it is only necessary to store the codewords of the super-row and, for the example of Table IV, the storage requirement is reduced to S₁=220 codewords.

In order to promote a high level of certainty in the performance of the speech information encoding method in the reduction of the speech data rate as disclosed herein, a large speech data base was used for the generation of the general transition probability matrices. This speech data base consisted of two parts. In the first part, 58 speakers of both sexes and of a wide variety of ages spoke 11 sentences each, the same for all speakers. All the sentences were collected in a sound booth with a high quality system. In the second part, five male and five female speakers spoke 62 sentences each, 41 of which were distinct speech material. 20 of these sentences were collected over local telephone lines, while the rest were high quality, sound booth speech. The total duration of the training material was about 1 hour of speech.

In addition to the training speech, nine sentences which were independent of the training set, were used to evaluate the actual performance of the encoding technique. These test sentences were collected either under high quality conditions or over the local telephone lines, and included men, women, and children.

To apply the encoding technique as hereinbefore described, both the training and the test speech were downsampled to 8 kHz and then LPC-analyzed using a 10-th order model. The analysis conditions were 20 msec frame period and 30 msec analysis window. 48 bits per frame were distributed among the different parameters as shown in Table IV. Under these conditions, the constant bit rate coding as typically practiced would have produced a speech data rate of 2400 bits per second.

Table VII summarizes the results for the optimal coding of the first order Markov model utilizing Huffman codewords in accordance with the present invention.

coincides with Table IV. The second row gives the predicted values of the bits for the Markov-Huffman coding in the long run. Rows 3-11 give the actual results of encoding the 9 test files, and row 12 gives the total average actual results. The last two rows refer to a zero order Markov model, where only the probability of occurrence of each quantization level is considered and Huffman coding is applied to that distribution. For the zeroth order Markov model, the results for the actual case of the 9 test files, and also the long term statisitically expected results are provided.

As can be seen from Table VII, Markov-Huffman coding in accordance with the present invention can reduce the bits per frame from 48 in the case of a constant bit rate system to an average of 37.1, a reduction of almost 23%. The overall actual average over the 9 test files is 36.6, in line with the statistical average. Also, as can be seen from the averages per file, there are no surprises and extrema, but all of the files exhibited a more or less uniform behavior. From the different speech parameters, it may be observed that the pitch parameter is most effectively represented through such a coding method, while on the other hand the bit reduction possible from reflection coefficient parameters K9 and K10 is of limited magnitude. This result may be explained by the fact that pitch tends to demonstrate a very smooth behavior over time, while the last two reflection coefficients K9 and K10 contain a lot of randomness. The last two rows show the statistical and the actual results when the 0-th order Markov model (i.e. no Markov model) is applied. It will be observed from

TABLE VII

Average bits per parameter and per frame for a first order Markov model. The results are for both statistical averages and actual averages for 9 test files. The last two rows are for the zeroth order Markov model.

|  | ENGY | PTCH | K1 | K2 | K3 | K4 | K5 | K6 | K7 | K8 | K9 | K10 | TOTL |
|---|---|---|---|---|---|---|---|---|---|---|---|---|---|
| ASSIGNED | 5 | 5 | 5 | 4 | 4 | 4 | 4 | 4 | 4 | 4 | 3 | 2 | 48 |
| MRKV-HUFF STATIST | 3.5 | 1.8 | 3.9 | 3.3 | 3.3 | 3.4 | 3.4 | 3.4 | 3.4 | 3.3 | 2.6 | 1.8 | 37.1 |
| FILE #1 | 3.9 | 1.8 | 3.8 | 3.3 | 3.2 | 3.5 | 3.4 | 3.2 | 3.4 | 3.2 | 2.6 | 1.8 | 37.1 |
| FILE #2 | 4.0 | 2.3 | 3.9 | 3.1 | 3.3 | 3.4 | 3.4 | 3.3 | 3.4 | 3.1 | 2.6 | 1.8 | 37.6 |
| FILE #3 | 4.3 | 2.5 | 4.1 | 3.5 | 3.7 | 3.4 | 3.5 | 3.4 | 3.5 | 3.4 | 2.8 | 1.8 | 40.0 |
| FILE #4 | 3.8 | 2.7 | 4.1 | 3.2 | 3.2 | 3.7 | 3.4 | 3.3 | 3.4 | 3.2 | 2.5 | 1.7 | 38.0 |
| FILE #5 | 4.2 | 2.0 | 3.6 | 3.1 | 3.1 | 3.3 | 3.2 | 3.4 | 3.4 | 3.3 | 2.6 | 1.7 | 36.7 |
| FILE #6 | 3.5 | 1.6 | 3.5 | 3.0 | 3.0 | 2.6 | 3.2 | 3.1 | 3.2 | 3.1 | 2.6 | 1.6 | 33.9 |
| FILE #7 | 4.0 | 1.9 | 3.7 | 3.0 | 3.0 | 3.1 | 3.4 | 3.4 | 3.2 | 3.5 | 2.6 | 1.7 | 36.5 |
| FILE #8 | 3.5 | 2.2 | 3.4 | 2.3 | 3.2 | 3.2 | 3.3 | 3.5 | 3.3 | 3.4 | 2.8 | 1.8 | 36.1 |
| FILE #9 | 3.4 | 2.2 | 4.2 | 3.3 | 3.7 | 3.6 | 3.4 | 3.4 | 3.6 | 3.3 | 2.7 | 1.9 | 38.9 |
| MRKV-HUFF ACTUAL | 3.8 | 2.0 | 3.7 | 3.0 | 3.2 | 3.2 | 3.3 | 3.3 | 3.3 | 3.3 | 2.6 | 1.7 | 36.6 |
| ONLY HUFF STATIST | 4.7 | 3.8 | 4.9 | 4.0 | 4.0 | 3.9 | 3.9 | 4.0 | 3.9 | 4.0 | 2.9 | 2.0 | 46.0 |
| ONLY HUFF ACTUAL | 4.8 | 4.5 | 4.9 | 4.1 | 3.9 | 4.1 | 3.8 | 4.0 | 3.8 | 3.9 | 3.0 | 2.0 | 46.7 |

The first column of Table VII describes the corresponding rows, while the second through the 13th columns give the assigned or average number of bits for each one of the 12 parameters. The final column gives the total bits per frame. The first row describes the bits assigned for the constant bit rate system and thereby the data of the last two rows of Table VII that regular Huffman coding without any Markov modeling offers no worthwhile reduction in the number of bits included in a given frame of speech data.

Table VIII shows results similar to Table VII, but for the second order Markov model.

TABLE VIII

Average bits per parameter and per frame for a second order Markov model. Both statistical and actual averages are shown.

|  | ENGY | PTCH | K1 | K2 | K3 | K4 | K5 | K6 | K7 | K8 | K9 | K10 | TOTL |
|---|---|---|---|---|---|---|---|---|---|---|---|---|---|
| ASSIGNED | 5 | 5 | 5 | 4 | 4 | 4 | 4 | 4 | 4 | 4 | 3 | 2 | 48 |
| MRKV-HUFF STATIST | 3.3 | 1.8 | 3.7 | 3.2 | 3.3 | 3.4 | 3.4 | 3.4 | 3.4 | 3.3 | 2.6 | 1.8 | 36.4 |
| FILE #1 | 3.8 | 2.2 | 4.2 | 3.3 | 3.1 | 3.4 | 3.4 | 3.3 | 3.4 | 3.3 | 2.7 | 1.8 | 37.9 |

TABLE VIII-continued

Average bits per parameter and per frame for a second order Markov model. Both statistical and actual averages are shown.

| | ENGY | PTCH | K1 | K2 | K3 | K4 | K5 | K6 | K7 | K8 | K9 | K10 | TOTL |
|---|---|---|---|---|---|---|---|---|---|---|---|---|---|
| FILE #2 | 4.0 | 2.7 | 4.3 | 3.1 | 3.2 | 3.3 | 3.2 | 3.2 | 3.4 | 3.2 | 2.5 | 1.8 | 38.0 |
| FILE #3 | 4.4 | 2.9 | 4.2 | 3.6 | 3.7 | 3.4 | 3.6 | 3.5 | 3.5 | 3.5 | 2.8 | 1.8 | 40.8 |
| FILE #4 | 4.0 | 4.3 | 4.4 | 3.2 | 3.2 | 3.6 | 3.3 | 3.3 | 3.4 | 3.2 | 2.4 | 1.6 | 39.9 |
| FILE #5 | 4.6 | 2.2 | 3.6 | 3.2 | 3.1 | 3.3 | 3.2 | 3.3 | 3.4 | 3.3 | 2.6 | 1.7 | 37.5 |
| FILE #6 | 3.4 | 1.7 | 3.5 | 2.9 | 3.0 | 2.6 | 3.2 | 3.1 | 3.1 | 3.1 | 2.6 | 1.6 | 33.7 |
| FILE #7 | 3.8 | 1.9 | 3.7 | 2.9 | 3.0 | 3.1 | 3.3 | 3.3 | 3.2 | 3.5 | 2.6 | 1.7 | 36.1 |
| FILE #8 | 3.4 | 3.0 | 3.2 | 2.3 | 3.2 | 3.2 | 3.4 | 3.6 | 3.3 | 3.4 | 2.8 | 1.8 | 36.3 |
| FILE #9 | 3.4 | 2.9 | 4.6 | 3.3 | 3.7 | 3.6 | 3.5 | 3.5 | 3.6 | 3.2 | 2.7 | 1.9 | 39.9 |
| MRKV-HUFF ACTUAL | 3.9 | 2.5 | 3.9 | 3.0 | 3.2 | 3.2 | 3.3 | 3.3 | 3.3 | 3.3 | 2.6 | 1.7 | 37.1 |

Table VIII indicates that in the long run an additional saving of only 0.7 bits per frame may be predicted when compared with the first order Markov model. In addition, the actual average number of bits per frame for the 9 test files for the second order Markov model is 37.1, i.e. 0.5 bits more than the corresponding value for the first order Markov model. Furthermore, in order to achieve even the long term savings by employing a second order Markov model, considerably more memory storage capacity would be required as compared to the first order Markov model. For practical purposes, therefore, the first order Markov model is preferred as the medium to form the conditional probabilities as the basis on which the Huffman coding is accomplished.

Tables IX and X show the corresponding results for the method-modifying procedures as previously described. Table IX gives the results for the case when matrices of the same dimensions are combined together, while Table X shows what happens when each matrix is represented by one row.

TABLE IX

"Super matrix" procedure

| | ENGY | PTCH | K1 | K2 | K3 | K4 | K5 | K6 | K7 | K8 | K9 | K10 | TOTL |
|---|---|---|---|---|---|---|---|---|---|---|---|---|---|
| ASSIGNED | 5 | 5 | 5 | 4 | 4 | 4 | 4 | 4 | 4 | 4 | 3 | 2 | 48 |
| MRKV-HUFF STATIST | 3.7 | 2.2 | 4.0 | 3.8 | 3.8 | 3.9 | 3.9 | 3.9 | 3.9 | 3.8 | 2.6 | 1.8 | 41.3 |
| FILE #1 | 4.1 | 2.2 | 3.8 | 3.8 | 3.8 | 3.9 | 4.0 | 3.8 | 3.9 | 3.7 | 2.6 | 1.8 | 41.3 |
| FILE #2 | 4.0 | 2.6 | 4.0 | 3.8 | 3.8 | 3.9 | 3.8 | 3.7 | 3.9 | 3.9 | 2.6 | 1.8 | 41.6 |
| FILE #3 | 4.6 | 2.9 | 4.3 | 3.9 | 4.1 | 3.9 | 3.8 | 4.0 | 4.0 | 3.8 | 2.8 | 1.8 | 43.8 |
| FILE #4 | 4.0 | 2.7 | 4.3 | 3.7 | 3.9 | 4.1 | 4.0 | 3.9 | 3.9 | 3.8 | 2.5 | 1.7 | 42.4 |
| FILE #5 | 4.2 | 2.4 | 3.7 | 3.7 | 3.8 | 3.9 | 3.8 | 3.9 | 4.0 | 3.8 | 2.6 | 1.7 | 41.4 |
| FILE #6 | 3.6 | 1.9 | 3.6 | 3.7 | 3.8 | 3.2 | 3.8 | 3.7 | 3.8 | 3.8 | 2.6 | 1.6 | 39.1 |
| FILE #7 | 4.2 | 2.4 | 3.8 | 3.7 | 3.7 | 3.6 | 3.8 | 3.9 | 3.9 | 4.0 | 2.6 | 1.7 | 41.3 |
| FILE #8 | 3.7 | 2.3 | 3.3 | 2.9 | 3.8 | 3.7 | 3.9 | 4.0 | 3.8 | 4.0 | 2.8 | 1.8 | 39.9 |
| FILE #9 | 3.5 | 2.8 | 4.3 | 3.9 | 4.1 | 4.1 | 4.0 | 4.0 | 4.0 | 3.8 | 2.7 | 1.9 | 43.2 |
| MRKV-HUFF ACTUAL | 3.9 | 2.4 | 3.8 | 3.6 | 3.8 | 3.7 | 3.8 | 3.8 | 3.9 | 3.8 | 2.6 | 1.7 | 41.1 |

TABLE X

"Super row" procedure

| | ENGY | PTCH | K1 | K2 | K3 | K4 | K5 | K6 | K7 | K8 | K9 | K10 | TOTL |
|---|---|---|---|---|---|---|---|---|---|---|---|---|---|
| ASSIGNED | 5 | 5 | 5 | 4 | 4 | 4 | 4 | 4 | 4 | 4 | 3 | 2 | 48 |
| MRKV-HUFF STATIST | 3.8 | 2.2 | 4.3 | 3.4 | 3.4 | 3.5 | 3.6 | 3.5 | 3.5 | 3.5 | 2.9 | 1.8 | 39.5 |
| FILE #1 | 4.0 | 2.4 | 4.0 | 3.4 | 3.2 | 3.6 | 3.5 | 3.4 | 3.6 | 3.4 | 2.9 | 1.9 | 39.3 |
| FILE #2 | 4.0 | 2.8 | 4.3 | 3.3 | 3.3 | 3.5 | 3.5 | 3.4 | 3.5 | 3.4 | 2.9 | 2.0 | 39.8 |
| FILE #3 | 4.8 | 3.3 | 4.5 | 3.6 | 3.8 | 3.6 | 3.8 | 3.7 | 3.7 | 3.6 | 2.8 | 1.9 | 43.1 |
| FILE #4 | 4.0 | 2.6 | 4.6 | 3.2 | 3.3 | 3.8 | 3.5 | 3.4 | 3.5 | 3.4 | 2.8 | 1.8 | 39.8 |
| FILE #5 | 4.3 | 2.6 | 3.8 | 3.3 | 3.2 | 3.4 | 3.4 | 3.5 | 3.6 | 3.3 | 2.9 | 1.7 | 39.0 |
| FILE #6 | 3.6 | 1.9 | 3.8 | 3.2 | 3.1 | 2.9 | 3.3 | 3.2 | 3.3 | 3.2 | 2.9 | 1.6 | 35.9 |
| FILE #7 | 4.2 | 2.3 | 3.9 | 3.1 | 3.1 | 3.2 | 3.5 | 3.5 | 3.2 | 3.6 | 2.9 | 1.7 | 38.4 |
| FILE #8 | 3.8 | 2.0 | 3.2 | 2.8 | 3.4 | 3.4 | 3.5 | 3.6 | 3.6 | 3.5 | 2.9 | 1.8 | 37.3 |
| FILE #9 | 3.8 | 2.6 | 4.6 | 3.5 | 3.8 | 3.7 | 3.6 | 3.5 | 3.8 | 3.4 | 2.9 | 2.0 | 41.2 |
| MRKV-HUFF ACTUAL | 4.0 | 2.4 | 4.0 | 3.2 | 3.3 | 3.4 | 3.5 | 3.4 | 3.5 | 3.4 | 2.9 | 1.8 | 38.7 |

The "super row" procedure, the results of which are tabulated in Table X, requires considerably less memory storage capability than the "super matrix" procedure whose results appear in Table IX and is a preferred technique.

Overall the present invention in encoding speech information is capable of achieving a significant reduction in bit rate. It should be understood that this reduction in bit rate does not have any impact on the speech quality, since it operates on the representation only of the quantization levels of the speech parameters. The trade-offs for the reduction in bit rate are increased memory storage requirements to accommodate the codewords and a variable bit rate system.

Referring more specifically to the drawings, FIG. 1a is a graphical representation showing the different quantization levels of a speech parameter in a regular representation thereof, wherein a four-level parameter quantization is shown. In the latter respect, the four quantization levels are depicted as q(i,1), q(i,2), q(i,3) and q(i,4) in ascending magnitudes. From the regular representation of the parameter quantization levels as illustrated in FIG. 1a, it may be observed that the quantization levels are ordered so as to have a sense of adjacency between the respective states or different quantization levels. FIG. 1b is a representation of a finite state machine for the speech parameter as derived from the four-level parameter quantization of FIG. 1a. FIG. 1c is a representation of the transition probabilities matrix corresponding to the finite state machine representing a speech parameter quantization as shown in FIG. 1b, wherein the transitional probabilities are based upon a first order Markov model. It will be recalled from the previous description that the transition probabilities depend only on the state of the speech parameter in the previous speech frame in a first order Markov model. As previously explained, the quantized speech parameter in a current speech frame is more likely to jump to adjacent states in the transition probability matrix than to states further away as the current speech frame is followed up by the next successive speech frame.

Figure 3:
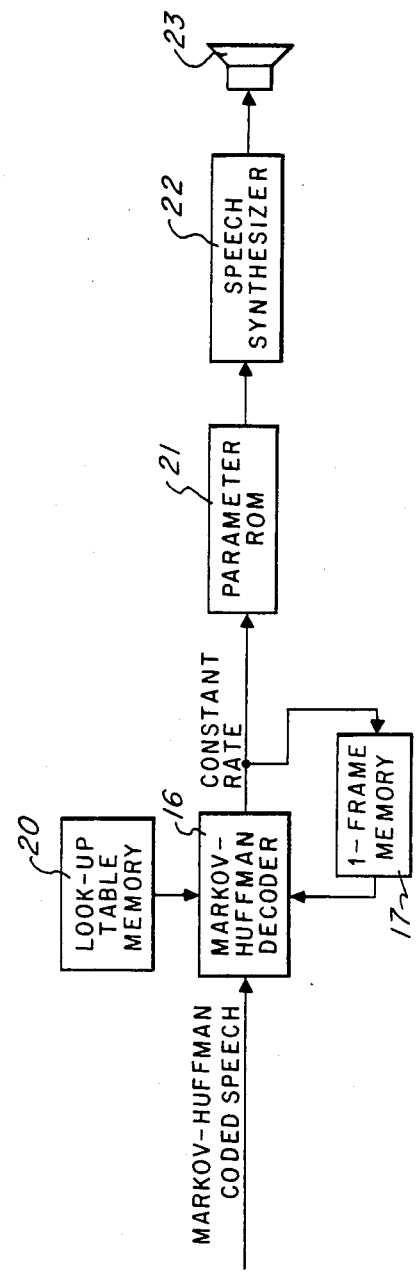
FIG. 3 is a functional block diagram of a speech synthesis system operating conjointly with the speech analysis system of FIG. 2 as a vocoder, wherein speech parameters as encoded in accordance with the present invention are provided as the source of speech data from which audible synthesized speech is provided.

The speech information encoding method and system as disclosed herein may be implemented in two basic types of speech processing systems, i.e. the speech analysis system of FIG. 2 and the speech synthesis system of FIG. 3, which may be effectively combined as a vocoder system incorporating both speech analysis and speech synthesis therein. Referring to FIG. 2, an individual operator-speaker may orally state human speech which is transformed to an analog speech signal via a transducer, such as a microphone (not shown). The oral speech as represented by the analog speech signal is then subjected to speech analysis by an analyzer 10 which converts the analog speech signal into a series of successive speech frames having a plurality of digital speech parameters which are representative of the analog speech signal. At this stage, the digital speech parameters are unprocessed and have absolute digital magnitudes. In a preferred embodiment, the coding technique to be employed in representing the digital speech data is linear predictive coding, with each speech frame having a total of 48 bits defining 12 separate speech parameters, including energy, pitch and ten reflection coefficients K1–K10 in the manner set forth in Table IV. The speech analyzer 10 operates to convert the analog speech signal into digital speech parameters including an excitation source signal, a pitch signal and the series of 10 reflection coefficients K1–K10.

The unprocessed digital speech parameters as derived by the analyzer 10 are then input to a quantizer 11 which operates to provide a digital code representation for the absolute numbers of the speech parameters as output from the analyzer 10. In this connection, the quantizer 11 assigns the coded bit representation to the magnitude of a speech parameter based upon its location within a particular one of a series of equal increment ranges making up the complete spectrum for the given bit evaluation of the particular speech parameter. By way of example, from Table IV, assume that the speech parameter K9 is the parameter of interest. The reflection coefficient K9 is assigned a coded representation of three bits, thereby having eight possible coded digital values, i.e. 000, 001, 010, . . . 111. Each of the eight coded digital representations is assigned an equal increment range on the complete range of values which the speech parameter K9 may assume. The actual value of the speech parameter K9 as output from the analyzer 10 is then matched to the appropriate increment within the eight possible value increments assigned to the speech parameter K9, and the matching digital code of three bits is given as the value of the speech parameter K9 by the quantizer 11. In this manner, each of the 12 speech parameters as shown in Table IV is identified by the appropriate digital code utilizing the respective bit lengths as words. Thus, the energy parameter is identified by five bits, for example, as contrasted to a three-bit identification for the parameter K9, with these respective bit lengths being constant for the particular parameter represented thereby in each successive speech data frame. The quantized values of the speech parameters in respective speech frames are thereby provided by the quantizer 11 as a series of digital codes which may be of variable bit length, as in Table IV, for example. However, it will be understood that each of the quantized speech parameters could be represented by a digital code having the same number of bits as compared to the other speech parameters.

It will further be understood that quantized speech parameter values at this stage are commonly employed in conjunction with a parameter memory, wherein the quantized parameter values in coded form are applied as respective addresses to a table of quantized values in the parameter memory such that the uncoded parameter values from the parameter memory of a constant bit length longer than the coded quantized parameter values are then processed by a speech synthesizer in the production of audible synthesized speech corresponding to the originally spoken speech. In accordance with the present invention, however, it is desired to further encode the already coded quantized speech parameter values in a manner producing a worthwhile reduction in the speech data rate by identifying the digital speech data with a reduced number of bits as compared to the number of bits included in each frame of speech data output from the quantizer 11. To this end, a Markov-Huffman coder 12 is provided, along with a speech frame memory 13, the coder 12 and the speech frame memory 13 being respectively connected to the output of the quantizer 11, and the output of the speech frame memory 13 also being connected to an input of the coder 12. In addition, a read-only-memory in the form of a look-up table 14 is coupled to the Markov-Huffman coder 12 for providing appropriate matrices with tables of Huffman codewords thereto (which may be in the form of respective "super" matrices or "super" rows in the modified versions of the method herein disclosed).

Thus, the quantizer 11 outputs coded digital speech data at a constant rate which may take the form of the speech frame identified in Table IV having a total content of 48 bits. At the same time, the quantizer 11 outputs a frame of speech data to the memory 13 which is delayed in sequence so as to present to the Markov-Huffman coder 12 a previous speech frame from the speech frame memory 13 together with the current speech frame direct from the output of the quantizer 11 for comparison of the corresponding speech parameters in the successive speech frames together with the appropriate table of Huffman codewords as accessed by the coder 12 from the look-up table memory 14. In accordance with the method as described herein, the Markov-Huffman coder 12 then assigns a new code to the quantized values of the speech parameters based upon the transition of the quantization states of respective speech parameter values in the manner previously described. The Markov-Huffman coder 12 then outputs at a variable bit rate (i.e., the corresponding parameters in successive speech frames may be represented by respective codewords having different bit lengths) the newly encoded speech data in which a significant reduction in the bit rate has been achieved without affecting the speech quality in any respect. This encoded speech data may then be stored in a memory 15, such as a read-only-memory shown in dashed lines in FIG. 2, for subsequent use or may be directly transmitted to a speech synthesizer system for use in producing audible synthesized speech therefrom, or be stored in a read-write memory (RAM) for store-and-forward applications.

In the latter respect, FIG. 3 illustrates the speech synthesizer system which may utilize the Markov-Huffman encoded speech as provided by the speech analyzer system of FIG. 2. Thus, the Markov-Huffman encoded speech is directed to the input of a Markov-Huffman decoder 16. A speech frame memory 17 is connected to the output of the decoder 16 in a feed-back loop such that the speech frame memory 17 stores successive speech frames as delayed from the current speech frame for input to the decoder 16. The decoder 16 then accesses the appropriate table of Huffman codewords from a read-only-memory 20 in the form of a look-up table memory coupled thereto in relation to corresponding speech parameters from the current and previous speech frames as directly delivered to the decoder 16 and via the frame memory 17, respectively. The Markov-Huffman decoder 16 then reconverts the Markov-Huffman coded speech at a constant rate into the coded digital speech corresponding to that produced by the quantizer 11 of the system of FIG. 2. Thus, the digital speech data is now in the form shown in Table IV and is presented as an input to a read-only-parameter memory 21 which comprises a look-up table of quantized values to be addressed by the respective bit codes indicative of the 12 speech parameters comprising a speech frame. The quantized values of the speech parameters of a constant bit length are then delivered from the speech parameter ROM 21 to a speech synthesizer 22 which processes the digital speech data as input thereto and produces an analog speech signal as an output to audio means in the form of a loud speaker 23 as coupled thereto. While the speech analysis and speech synthesis systems in which the method of encoding digital speech information in accordance with the present invention may be implemented to produce a worthwhile reduction in the bit data rate have been described conceptually by way of drawings, it will be understood that the techniques herein described may be controlled and practiced by means of a general purpose computer and fixed instruction sets stored in read-only-memories (ROMS) as a practical means of practicing the present invention and is further implemented in the Fortran code in the attached appendix which is hereby incorporated by reference.

Figure 4A:
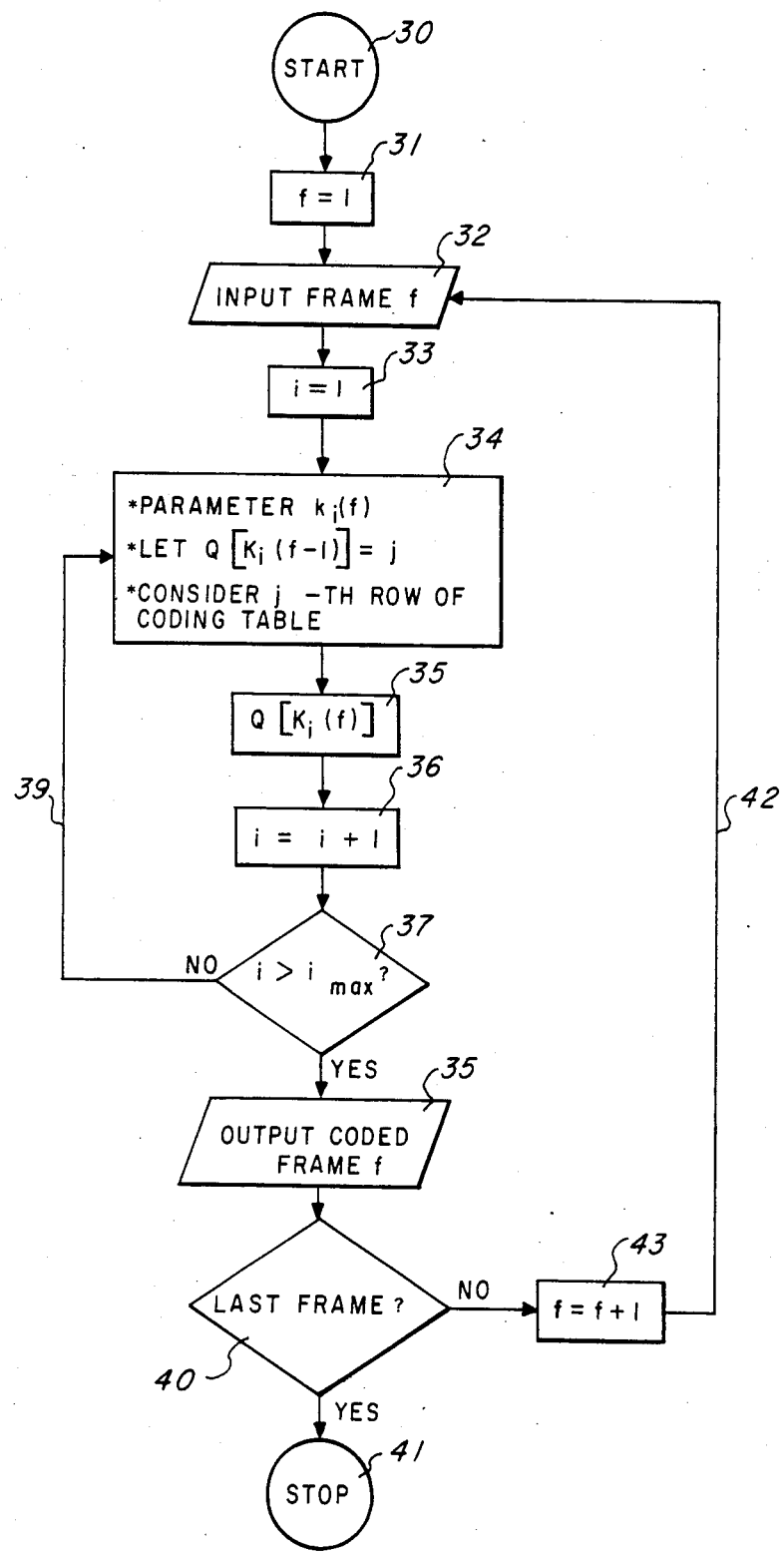
FIG. 4a is a flowchart showing the encoding of speech parameters in accordance with the present invention.
Figure 4B:
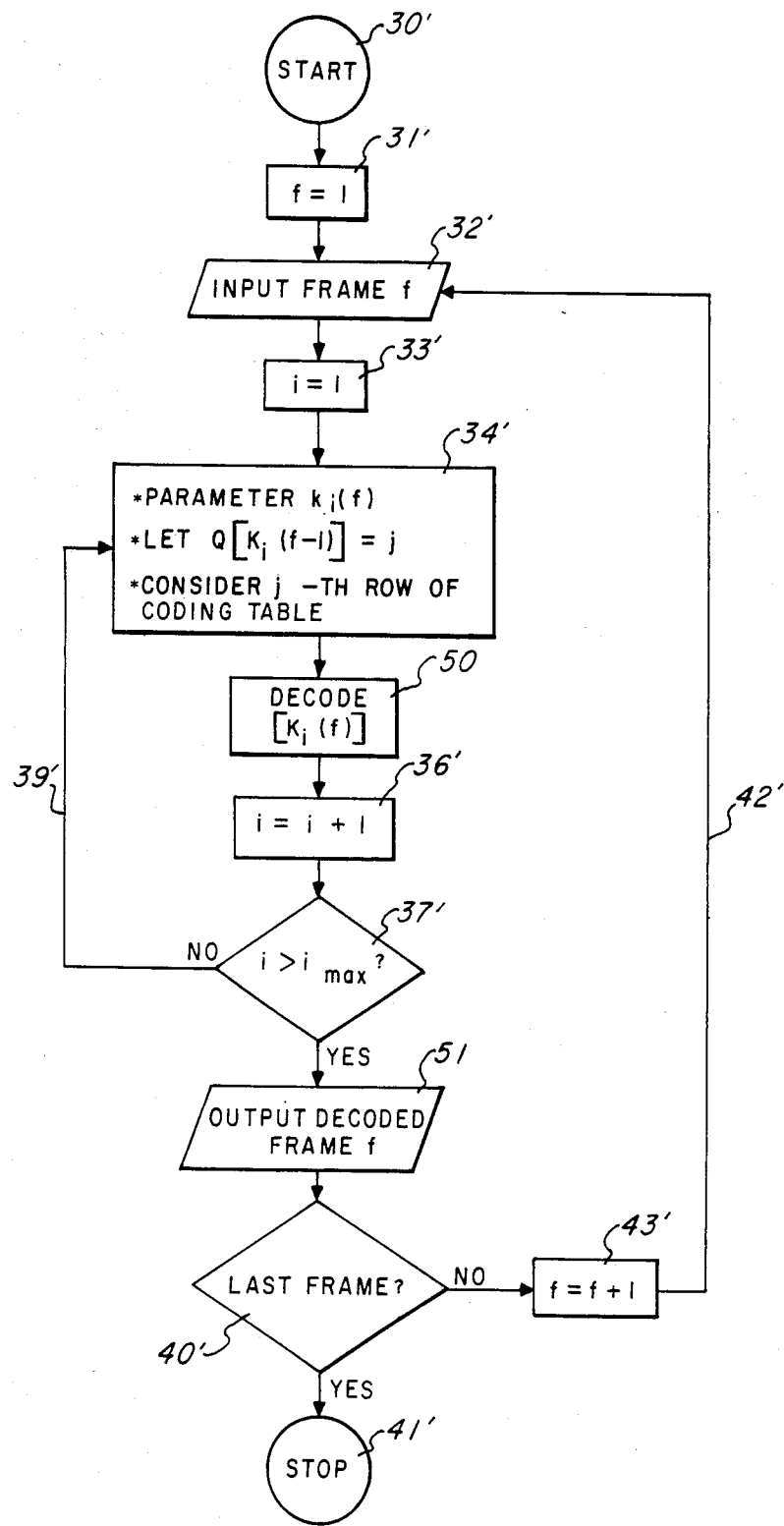
FIG. 4b is a flowchart similar to that shown in FIG. 4a, but showing the synthesis of speech relying upon a speech data base encoded in accordance with the present invention.

In the latter respect, FIGS. 4a and 4b illustrate respective flowcharts in which speech analysis (FIG. 4a) is carried out in conjunction with the system of FIG. 2, and speech synthesis (FIG. 4b) is carried out in conjunction with the system of FIG. 3 in which the Fortran code of the attached appendix may be utilized. Referring to FIG. 4a, oral speech as represented by an analog speech signal at the start 30 is divided into respective frames of digital speech data, and a first frame 31 of quantized speech parameters is input as at 32 into a Markov-Huffman coding procedure, wherein a quantized parameter is represented by the state having an index i=1 as at 33. The speech parameter is quantized to a level $k_i$ where k is the index for the parameter and i is the index of the state as at 34. For the previous frame of digital speech data, it is assumed that the corresponding speech parameter $K_{i(f-1)}$ is quantized to some level j so as to consider the j-th row of the Huffman coding table in the coding procedure initiated at 34. The speech parameter quantized value for the speech parameter $K_{i(f)}$ for the current frame as at 35 then has its index i incremented by 1 to move to the next parameter as at 36. A comparison is then made as to whether the index i is greater than $i_{max}$ as at 37. If the answer is "yes", the coding procedure continues by providing the Markov-Huffman coded frame f as an output as at 38. If the index i is not greater than $i_{max}$, the next parameter $K_i+1$ is coded. In this respect, the procedure returns via a parameter loop 39 to the initiating processing at 34 and another parameter is then coded in the same manner. This procedure continues until all of the parameters in a speech frame are coded, such that the index i is greater than $i_{max}$, whereupon the coded frame f is output as at 38.

The procedure continues by testing for the last frame as at 40 in the series of digital speech frames being processed. If the answer is "yes", the coding procedure stops as at 41. If the answer is "no", indicating that additional digital speech frames are to be considered for coding, the procedure passes through frame loop 42 incrementing the frame number from f to f+1, etc. as at 43, and the new frame, f+1, for example, is input as at 32 to continue the coding procedure.

FIG. 4b is a flowchart providing speech synthesis from a speech data base of Markov-Huffman encoded digital speech information as obtained from the flowchart of FIG. 4a. Accordingly, FIG. 4b is implemented in the speech synthesis system of FIG. 3 and is similar to the encoding technique of FIG. 4a, being a reversal thereof in returning the Markov-Huffman encoded digital speech data to decoded digital speech parameters for synthesis and eventual reproduction as audible speech. Thus, the factors involved in the processing of the digital speech information is encoding it via a Markov-Huffman coding procedure in accordance with the present invention as illustrated in FIG. 4a are repeated in the speech synthesis procedure of FIG. 4b in most instances. Where so repeated, these factors have been identified by the same reference numeral with the prime notation added. In FIG. 4b, however, the digital speech data at the initiating step 34' is represented by Markov-Huffman coding. Thus, the speech parameter $K_{i(f)}$ for the first frame is then decoded to return it to the form in which it existed prior to the Markov-Huffman coding, as at 50. The other departure in the procedure of FIG. 4b from that illustrated in FIG. 4a occurs as to the nature of the frame f which is output at the conclusion of the comparison tests accomplished at 37'. In the instance of FIG. 4b, the frame f which is output as at 51 has been decoded to a form suitable for use by a speech synthesizer such that further processing thereof by the speech synthesizer will result in audible speech.

While the present invention has been described with specific reference to its use in further encoding speech parameters which have been initially encoded using a linear predictive coding technique, it will be understood that the invention may be practiced upon speech parameters based upon speech data representation techniques other than linear predictive coding. In this sense, although preferred embodiments of the invention have been specifically described, it will be understood that the invention is to be limited only by the appended claims, since variations and modifications of the preferred embodiments will become apparent to persons skilled in the art upon reference to the description of the invention herein. Therefore, it is contemplated that the appended claims will cover any such modifications or embodiments that fall within the true scope of the invention.

APPENDIX to U.S. Application (Docket No. TI-10283 METHOD AND SYSTEM FOR ENCODING DIGITAL SPEECH INFORMATION - Panagiotis E. Papamic...s)

```
        PROGRAM MARKOV_LPC
C
C*****************************************************************
C       This progran analyzes speech frame by frame
C       (separating voiced/unvoiced frames and discarding silence) and
C       computes the reflection coefficients using the autocorrelation method.
C       The LPC parameters are then quantized and the first and second
C       order transitional probabilities are computed.
C
C          STRUCTURE OF DATA FILE (FREE FORMATED):
C               Linear(1), Max entropy(2), Min deviation(3) Quant.
C               Energy bits/frame
C               Pitch bits/frame
C               Flag: <= 0 externally assigned bits for param
C               LPC parameters: RC(18), LAR(19), ASIN(20)
C               LPC encoding bits/frame
C               Flag: 1=Unified tables, 2=Separate V-UV tables.
C
C       NOTE:  If a frame has energy < 1, it is considered silence;
C              It is also considered silence if it is unvoiced
C              (pitch=0) and has energy < 3.
C
C       MRV (N-MINUS-2, N-MINUS-1, N, LPC-PARAM, V-UV)
C
C       18 JUL 83: The program is modified to accept as input either DS
C                  files or LPC files.
C       25 AUG 83: The program is modified to compute both 1st and 2nd
C                  order Markov statistics.
C*****************************************************************
C
        PARAMETER (MAX_LFV=128)
        PARAMETER (NPARAM=12)

CHARACTER*78 INSPCH,INSTAT, STFILE
        CHARACTER*3 NSTATUS
        CHARACTER*8 NAME
        CHARACTER*78 NDESCR

INTEGER*2 STUN, ISPEECHUN, IERR, IFRAME, NSAMP, ISAMP, LFRAME
        INTEGER*2 NSPRD, IDATATYP
        INTEGER*2 INT21, INT22, INT23
        INTEGER*2 IP(2000),INSPEECH(512),IREAL(2)
        INTEGER*2 MRV1(999999)
        INTEGER*2 IQLEV(NPARAM, 3), IPTR(400)
        INTEGER*2 NLEVELS(NPARAM)
        INTEGER*2 INPARAM(NPARAM)

INTEGER*4 MRV(499999)
        INTEGER*4 IOFF(NPARAM), IOFF2(NPARAM)
        INTEGER*4 ICPTR(100,2),IFORM(30)

DIMENSION CODE(10000,2),DECODE(10000,2)
        DIMENSION SPEECH(512),RC(20),A(20), STEP(10)
        DIMENSION PMAGN(20),FORW(512),BACK(512)

EQUIVALENCE (ICPTR(1,1), IPTR(1))
        EQUIVALENCE (MRV(1), MRV1(1))

LOGICAL*2 EOF,CONVERGE, FLLST, NEWFILE
        INCLUDE 'UD:[PANOS.ROOTS]HEADER.FRM'
C
C*****************************************************************
```

```
C       INPUT ENCODING DATA
C***************************************************************
C
        ALPHA = 0.9375      ! Preemphasis constant.
        FLLST = .FALSE.
        STUN = 1
        LUN = 2
        IFILE=3
        ISPEECHUN = 4
        NFRM = 0
        LPC = 10
        NWDWANT = 499999

CALL CLEAR (MRV(1), 2*NWDWANT)
C
C       QUANTIZATION FILE
C
C
C       CALL GET1_STRING ('Parameter file (Default: MARKOV.DAT)',
C     1                                              STFILE,LENGTH)
C       IF (LENGTH.EQ.0) THEN
                STFILE = 'UD:[PANOS.PROJECT]MARKOV.DAT'
                LENGTH = 28
C       END IF
        OPEN (UNIT=LUN,NAME=STFILE,TYPE='OLD')
        READ (LUN,*) IFORM(1)     ! Linear(1), Max entr.(2), Min dev.(3) Quant.
        READ (LUN,*) ICPTR(2,1)   ! Energy bits/frame
        READ (LUN,*) ICPTR(4,1)   ! Pitch bits/frame
        READ (LUN,*) IFORM(4)     ! Flag:<=0 ext. bits for param
        READ (LUN,*) LPC_PARAM    ! LPC parameters: RC(18), LAR(19), ASIN(20)
        READ (LUN,*) LPC_BITS     ! LPC encoding bits/frame
        READ (LUN,*) IVUV_TAB     ! Flag: 1=Unified tables, 2=separate V-UV tab
        READ (LUN,*) FRAME        ! Frame period (msec)
        READ (LUN,*) WIND         ! Window size (msec)
        IF (FRAME .GT. WIND) STOP 'Frame .GT. Window'
        IF (IFORM(4) .LE. 0) THEN ! external bits for LPC parameters.
                DO I = 1, 2*LPC
                        READ (LUN, *) IFORM(5+I)
                END DO
        ELSE
                IFORM(4) = LPC_BITS
        END IF
        CLOSE (UNIT=LUN)
        IFORM(2) = LPC_PARAM
        IFORM(5) = 101 + IVUV_TAB * 10
C
C       STATISTICS FILE
C
        IF (IVUV_TAB .EQ. 2) THEN ! seperate tables.
C               CALL GET1_STRING ('Histogram file (Default: ROOT500A.DAT)',
C     1                                              STFILE,LENGTH)
C               IF (LENGTH.EQ.0) THEN
                        STFILE = 'UD:[PANOS.ROOTS]ROOT500A.DAT'
                        LENGTH = 28
C               END IF
        ELSE IF (IVUV_TAB .EQ. 1) THEN ! unified tables
C               CALL GET1_STRING ('Histogram file (Default: ROOT500C.DAT)',
C               IF (LENGTH.EQ.0) THEN
                        STFILE = 'UD:[PANOS.ROOTS]ROOT500C.DAT'
                        LENGTH = 28
C               END IF
        END IF
        CALL SP_OPEN_OLD (STUN,'#'//STFILE(1:LENGTH),IERR)
        CALL SP_RETCODE (IERR)
        CALL SP_GET_HEADER (STUN,HEADER,IERR)
        CALL SP_RETCODE (IERR)
        LPC=SD_ORDRLPC 80      CALL GET1_STRING
     1      ('File with transition probab.(Def: (DATA1)MRKV.DAT)',
     1                                              INSTAT,LENGTH1)
        IF (LENGTH1.EQ.0) THEN
                INSTAT = 'DATA1:[SPCH.PANOS.MARKOV]MRKV.DAT'
                LENGTH1 = 33
```

```
              END IF

CALL GET1_STRING ('Is that file NEW or OLD? (Def: NEW)', STFILE,LENGTH)
        IF (STFILE(1:1).EQ.'O' .OR. STFILE(1:1).EQ.'o') THEN
              INQUIRE (FILE=INSTAT(1:LENGTH1), EXIST=NEWFILE)
              IF (.NOT.NEWFILE) GO TO 80
              NEWFILE = .FALSE.
        ELSE
              NEWFILE = .TRUE.
        END IF
C
C*********************************************************************
C     CREATE ENCODING / DECODING TABLES
C*********************************************************************
C
        STEP(3)=1.5*16./2.**ICPTR(2,1)   ! Step for energy
        CALL CDTABLES (LPC,LPCD,STUN,ICPTR,CODE,DECODE,IFORM,STEP)
        CALL SP_CLOSE (STUN,IERR)
        CALL SP_RETCODE (IERR)

! Set up offset indices for Markov array / transition matrix.

IOFF(1) = 0
        DO I = 1, NPARAM-1
              NLEVELS(I) = 2**ICPTR(2*I, 1)
              IOFF(I+1) = IOFF(I) + NLEVELS(I)**2
        END DO
        NLEVELS(NPARAM) = 2**ICPTR(2*NPARAM, 1)
        IOFF2(1) = IOFF(NPARAM) + NLEVELS(NPARAM)**2
        DO I = 1, NPARAM-1
              IOFF2(I+1) = IOFF2(I) + FLOAT(NLEVELS(I))**3
        END DO
        NWDWANT = IOFF2(NPARAM) + FLOAT(NLEVELS(NPARAM))**3

IF (.NOT.NEWFILE) THEN
              CALL SP_OPEN_OLD (STUN, '#'//INSTAT(1:LENGTH1), IERR)
              CALL SP_RETCODE (IERR)
              CALL SP_READ (STUN, 1, 401, 2*NWDWANT, IDIDNT, MRV1, IERR)
              CALL SP_RETCODE (IERR)
              CALL SP_CLOSE (STUN,IERR)
              CALL SP_RETCODE (IERR)
        END IF

! Convert the tables to tables for K-parameters

DO IVU = 1, IVUV_TAB
              NNTOT = ICPTR(2*LPC+3,IVU) + 2**(ICPTR(2*LPC+4,IVU)) + 1 -
     1                                                    ICPTR(5,IVU)
              IF (IFORM(2) .EQ. 20) THEN
                    DO I = ICPTR(5,IVU)+1, ICPTR(5,IVU)+NNTOT
                           CODE(I,IVU) = SIN (CODE(I,IVU))
                           DECODE(I,IVU) = SIN (DECODE(I,IVU))
                    END DO
              ELSE IF (IFORM(2) .EQ. 19) THEN
                    CALL LAR_TO_K (CODE(ICPTR(5,IVU)+1,IVU), NNTOT,
     1                                        CODE(ICPTR(5,IVU)+1,IVU))
                    CALL LAR_TO_K (DECODE(ICPTR(5,IVU)+1,IVU), NNTOT,
     1                                      DECODE(ICPTR(5,IVU)+1,IVU))
                 DO J = 1, LPC  ! rearrange the arrays in ascending order.
                       NPOINTS = 2**(ICPTR(2*J+4,IVU))
                       IFIRST = ICPTR(2*J+3,IVU)
                       ILAST = IFIRST + NPOINTS + 1
                       CODE(IFIRST+NPOINTS/2+1,IVU) =
     1                            CODE(IFIRST+NPOINTS/2+1,IVU)
                       DO I = 1, NPOINTS/2
                              CODE(IFIRST+I,IVU) =
     1                                CODE(IFIRST+I,IVU)
                              CODE(ILAST+1-I,IVU) =
     1                                CODE(ILAST+1-I,IVU)
                              DECODE(IFIRST+I,IVU) =
     1                                DECODE(IFIRST+I,IVU)
                              DECODE(ILAST-I,IVU) =
     1                                DECODE(ILAST-I,IVU)
```

```
                              STORE = CODE(IFIRST+I,IVU)
                              CODE(IFIRST+I,IVU) = CODE(ILAST+1-I,IVU)
                              CODE(ILAST+1-I,IVU) = STORE
                              STORE = DECODE(IFIRST+I,IVU)
                              DECODE(IFIRST+I,IVU) = DECODE(ILAST-I,IVU)
                              DECODE(ILAST-I,IVU) = STORE
                           END DO
                     END DO
               END IF
         END DO

100      CALL GET1_STRING
        1        ('Input spch filename (E=end, @file= list, Def:NAMEFILE.DAT)',
        2                                              INSPCH, LENGTH)
         IF (LENGTH.NE.0) THEN
                 IF (INSPCH(1:1) .NE. '@') GO TO 155
                 FLLST = .TRUE.
                 OPEN (UNIT=IFILE, NAME=INSPCH(2:), TYPE='OLD')
         ELSE
                 FLLST = .TRUE.
                 OPEN (UNIT=IFILE,
        1                NAME='UD:[PANOS.ROOTS]NAMEFILE.DAT',TYPE='OLD')
         END IF
140      FORMAT (Q,A)
150      READ (IFILE,140) LENGTH, INSPCH
155      IF (INSPCH.EQ.'E') GO TO 400
         CALL SP_OPEN_OLD (ISPEECHUN,'#'//INSPCH(1:LENGTH),IERR)
         CALL SP_RETCODE (IERR)
         CALL SP_GET_HEADER (ISPEECHUN,HEADER,IERR)
         CALL SP_RETCODE (IERR)
         CALL DOUBLE (SD_NAME(1),%REF(NAME),4)
         CALL DOUBLE (SD_DESCR(1),%REF(NDESCR),39)

250      TYPE *,' THE FILE NAME AND DESCR. :'
         TYPE *,NAME
         TYPE *,NDESCR
         IF (SD_DATATYPE .EQ. 1) THEN    ! DS file
                 IFRAME=FRAME*1000./FLOAT(SD_SAMPERIOD)+.5
                 IWIND=WIND*1000./FLOAT(SD_SAMPERIOD)+.5
                 CALL CLEAR (SPEECH(1),1024)
                 EOF=.FALSE.
                 SLAST=0.                    ! PREVIOUS FRAME'S LAST VALUE
                 IF (IANAL.EQ.1) CALL HAMWIN (IWIND)
C
C        PITCH TRACKING
C
                 ISAMP=SD_SAMPERIOD
                 CALL PTOPTT (ISPEECHUN,FRAME,10.,2.,25.,8.,ISAMP,NSAMP,IP)
         ELSE ! LPC file
                 NUMFR = SP_NUMFRAMES
                 LFRAME = LPC + 2
                 NFRAME = LFRAME
         END IF
C
C*****************************************************************
C        INPUT SPEECH DATA
C*****************************************************************
C
         NUMFRAME=0
260      NUMFRAME=NUMFRAME+1
         IF (SD_DATATYPE .EQ. 1) THEN ! DS file
                 CTIME = (NUMFRAME-0.5)*FRAME/1000.
                 CALL SP_GET_FRAME (ISPEECHUN,CTIME,WIND,INSPEECH,IWIND,IERR)
                 IF (IERR.EQ.1601) THEN   ! end of file
                         CALL SP_WAIT (ISPEECHUN, IERR)
                         CALL SP_RETCODE (IERR)
                         CALL SP_CLOSE (ISPEECHUN, IERR)
                         CALL SP_RETCODE (IERR)
                         IF (FLLST) GO TO 150
                         GO TO 100
                 END IF
```

```
              CALL SP_RETCODE (IERR)
              DO 300 I=IWIND,2,-1              ! PREEMPHASIS
300           SPEECH(I)=INSPEECH(I)-ALPHA*INSPEECH(I-1)
              SPEECH(1)=INSPEECH(1)-ALPHA*SLAST
              SLAST=INSPEECH(IFRAME)
C
C*******************************************************************
C       PROCESS SPEECH AND COMPUTE THE LPC COEFFICIENTS
C*******************************************************************
C
              ENERGY=0.
              DO 320 I=1,IWIND
320           ENERGY=ENERGY+SPEECH(I)**2
              ENERGY=SQRT(ENERGY/FLOAT(IWIND))
              RC(1) = ENERGY
              RC(2) = IP(NUMFRAME)
C
C
              IF ((ENERGY.LE.1.) .OR. (ENERGY.LT.3.AND.IP(NUMFRAME).EQ.0))
     1                        GO TO 260 ! Discard silence
              L10=LPC
C
C       BURG'S METHOD
C
              IF (IANAL.EQ.0) THEN
                 NWORDS=2*IWIND
                 CALL DOUBLE (SPEECH(1),FORW(1),NWORDS)
                 CALL DOUBLE (SPEECH(1),BACK(1),NWORDS)
C
                 CALL BURG1 (1,L10,FORW,BACK,RC(3),IWIND)
              ELSE
C
C       AUTOCORRELATION ANALYSIS
C
                 CALL AUTOC1 (SPEECH,L10,FORW)
                 CALL LGSOL (FORW,L10,RC(3),BACK)
                 DO I=3,LPC+2
                        RC(I)=-RC(I)
                 END DO
              END IF
C
              IVU = 1
              IF (IVUV_TAB.EQ.2 .AND. IP(NUMFRAME).EQ.0) IVU=2
        ELSE ! LPC file
              IF (NUMFRAME .GT. NUMFR) THEN
                     CALL SP_CLOSE (ISPEECHUN, IERR)
                     CALL SP_RETCODE (IERR)
                     IF (FLLST) GO TO 150
                     GO TO 100
              END IF
              CALL SP_READ (ISPEECHUN, LFRAME, NUMFRAME, NFRAME, IDIDNT,
     1                            INPARAM, IERR)
              CALL SP_RETCODE (IERR)
              IF ((INPARAM(1).LE.1) .OR. (INPARAM(1).LT.3.AND.INPARAM(2).EQ.
     1                   0)) GO TO 260 ! Discard silence
              IVU = 1
              IF (IVUV_TAB.EQ.2 .AND. INPARAM(1).EQ.0) IVU=2
              DO I = 1, LPC+2
                     RC(I) = INPARAM(I)
                     IF (I .GE. 3) RC(I) = RC(I) / 32768.
              END DO
        END IF ! LPC parameter coding
        NFRM = NFRM + 1
        DO I=1,LPC+2
              CALL CODER (RC(I), CODE(ICPTR(2*I-1,IVU)+1, IVU),
     1                                   ICPTR(2*I, IVU), ICODE)
              IQLEV(I,1) = ICODE
              INDEX = (IQLEV(I,2)-1) * NLEVELS(I) + IQLEV(I,1)
              INDEX2 = INDEX + (IQLEV(I,3)-1) * NLEVELS(I)**2
              IF (NFRM .GE. 2) MRV(INDEX+IOFF(I)) = MRV(INDEX+IOFF(I)) + 1
              IF (NFRM .GE. 3) MRV(INDEX2+IOFF2(I)) = MRV(INDEX2+IOFF2(I)) +1
```

```
              IQLEV(I,3) = IQLEV(I,2)
              IQLEV(I,2) = IQLEV(I,1)
        END DO

GO TO 260
C
C
C
C*********************************************************************
C       OUTPUT STATISTICS
C*********************************************************************
C
400     SP_FRPERIOD=FRAME
        SP_WINDOWL=WIND
        SD_ORDRLPC=LPC
        SD_DATATYPE=29
        IANAL = 1
        HEADER(159)=IANAL
        IDATATYP=SD_DATATYPE
        NSPRD=SD_SAMPERIOD
        IF (NEWFILE) THEN
                CALL SP_OPEN_NEW ('#'//INSTAT(1:LENGTH1),NAME,IDATATYP,NSPRD,
     1                  NDESCR,STUN,NEWID,IERR)
        ELSE
                CALL SP_OPEN_OLD (STUN, '#'//INSTAT(1:LENGTH1), IERR)
        END IF
        CALL SP_RETCODE (IERR)

CALL SP_PUT_HEADER (STUN,HEADER,IERR)
        CALL SP_RETCODE (IERR)

CALL SP_WRITE (STUN,1,1, 400, IPTR,IERR)
        CALL SP_RETCODE (IERR)
        CALL SP_WRITE (STUN, 1, 401, 2*NWDWANT, MRV1,IERR)
        CALL SP_RETCODE (IERR)
C
        CALL SP_CLOSE (STUN,IERR)
        CALL SP_RETCODE (IERR)
        STOP
C
C
        END
        PROGRAM MRKVHUFF
C
C*********************************************************************
C      This program accepts as input an analysis file of
C      reflection coefficients, and encodes them with regular coding
C      according to the specifications of a data file.
C      Only the average bit rate is computed
C      on the assumption that Huffman coding is used, combined
C      with a first order Markov model.
C      The first statistics file contains the first order Markov
C      transition probabilities matrices of the parameters.
C      The second statistics file contains the histograms of the
C      LPC parameters to be used in encoding.
C         STRUCTURE OF DATA FILE (FREE FORMATED):
C
C             Linear(1), Max entropy(2), Min deviation(3) Quant.
C             Energy bits/frame
C             Pitch bits/frame
C             Flag: <= 0 externally assigned bits for param
C             LPC parameters: RC(18), LAR(19), ASIN(20)
C             LPC encoding bits/frame
C             Flag: 1=regular Huffman, 2=combined tables, 3=1 row per matrix
C             Flag: 1=Unified tables, 2=Separate V-UV tables.
C
C      NOTE:  If a frame has energy < 1, it is considered silence;
C             It is also considered silence if it is unvoiced
C             (pitch=0) and has energy < 3.
C      7 JULY 82: The coding/decoding tables are always converted to
C             tables for K-parameters, and, hence, it is not necessary
C             to convert the parameter of the input analysis file.
```

```
C        9 JULY 82: The length of coding and decoding tables for all the
C                   parameters (except Energy and Pitch) is increased
C                   by 1, so that the coding levels include the right end of
C                   the parameter's dynamic range.
C        3 NOV 82:  The program is modified to give the option to use
C                   either unified coding/decoding tables, or separate tables
C                   for V-UV speech.
C        7 JAN 83:  A list of input files can be
C                   given by typing @filename.
C******************************************************************
C
         PARAMETER (NPARAM=12)
         PARAMETER (MAX_LEV=128)

DIMENSION CODE(10000,2),DECODE(10000,2)
         DIMENSION ICPTR(100,2), ICPTR1(100,2), IFORM(12)
         DIMENSION RC(15), A(15), AF(15), A1(15), STEP(5)
         DIMENSION PITCHEN(2), FHIST(140)
         DIMENSION CF(15), BW(15), CFIN(15), BWIN(15)
         DIMENSION AVBTS(NPARAM+1), AVBTS_NO_MRKV(NPARAM+1)

INTEGER*2 MRV1(999999)
         INTEGER*2 LNG_NO_MRKV(NPARAM*MAX_LEV)
         INTEGER*2 IHUFF(499999)
         INTEGER*2 IPTR(400), NLEVELS(NPARAM)
         INTEGER*2 INPARAM(15),OUTPARAM(15),INUN,OUTUN,STUN
         INTEGER*2 LFRAME,IERR,NFACTR,ISAMPD,IDATATP,LENGTH
         INTEGER*2 ICX(15), ICFL(15), IOR(15), IANGLE(15)
         INTEGER*2 IQLEV(20), IQLEV1(20), NLEV(20,2)
         INTEGER*2 MODESTAT(20), ISTAT(20,6,3) ! ISTAT(param#,mode,V/UV/Mixed)
         INTEGER*2 ICNT(20,2)
         INTEGER*2 MAXEGY INTEGER*4 MRV(499999)
         INTEGER*4 IOFF(NPARAM), IOFF1(NPARAM), IOFF2(NPARAM)
         INTEGER*4 NBITS(NPARAM), NBITS1(NPARAM)
         INTEGER*4 NBITSF(NPARAM), NBITS1F(NPARAM)

EQUIVALENCE (MRV1(1), MRV(1))

CHARACTER CPARAM(NPARAM+1)*4
         CHARACTER*80 STFILE,INFILE,OUTFILE,INF1,OUTF1
         CHARACTER*78 NDESCR
         CHARACTER*8 NAME,LABEL
         LOGICAL*2 CONVERGE, INLIST, OUTLIST, OUTPUT, OUTSTAT
         LOGICAL*2 FLAG            ! Flag to signal final choice of parameters.
         INCLUDE 'UD:[PANOS.ROOTS]HEADER.FRM'

DATA CPARAM/'ENGY','PTCH','K1  ','K2  ','K3  ','K4  ','K5  ',
        1            'K6  ','K7  ','K8  ','K9  ','K10 ','TOTL'/

EQUIVALENCE (IPTR(1), ICPTR1(1,1))

INUN = 1
         OUTUN = 2
         LUN=3
         STUN=4
         IUN1 = 7
         IUN2 = 8
         INLIST = .FALSE.
         OUTLIST = .FALSE.
         OUTPUT = .TRUE.
         OUTSTAT = .TRUE.
C
C******************************************************************
C        INPUT ENCODING DATA
C******************************************************************
C
C        QUANTIZATION FILE
C
         CALL GET1_STRING ('Quant. data file (Default: MRKVHUFF.DAT)',
        1                                         STFILE,LENGTH)
         IF (LENGTH.EQ.0) THEN
```

```
                    STFILE = 'UD:[PANOS.PROJECT]MRKVHUFF.DAT'
                    LENGTH = 27
            END IF
            OPEN (UNIT=LUN,NAME=STFILE,TYPE='OLD')
            IFORM(5) = 101
            READ (LUN,*) IFORM(1)    ! Linear(1), Max entr.(2), Min dev.(3) Quant.
            READ (LUN,*) ICPTR(2,1)  ! Energy bits/frame
            READ (LUN,*) ICPTR(4,1)  ! Pitch bits/frame
            READ (LUN,*) IFORM(4)    ! Flag:<=0 ext. bits for param
            READ (LUN,*) LPC_PARAM   ! LPC parameters: RC(18), LAR(19), ASIN(20)
            READ (LUN,*) LPC_BITS    ! LPC encoding bits/frame
            READ (LUN,*) IHUFF_TAB   ! Flag: 1=regular Huffman, 2=combined tables
!                                      3=collapse matrix in a row, -1=2nd order Mrkv
            READ (LUN,*) IVUV_TAB    ! Flag: 1=Unified tables, .=separate V-UV tab
            IF (IVUV_TAB. NE. 1) IVUV_TAB = 2
            IFORM(5) = 10 * IVUV_TAB + IFORM(5)
C
C           STATISTICS FILE
C
            IF (IVUV_TAB .EQ. 2) THEN ! separate tables.
                    CALL GET1_STRING ('Histogram file (Default: ROOT500A.DAT)',
        1                                                    STFILE,LENGTH)
                    IF (LENGTH.EQ.0) THEN
                            STFILE = 'UD:[PANOS.ROOTS]ROOT500A.DAT'
                            LENGTH = 28
                    END IF
            ELSE IF (IVUV_TAB .EQ. 1) THEN ! unified tables
                    CALL GET1_STRING ('Histogram file (Default: ROOT500C.DAT)',
        1                                                    STFILE,LENGTH)
                    IF (LENGTH.EQ.0) THEN
                            STFILE = 'UD:[PANOS.ROOTS]ROOT500C.DAT'
                            LENGTH = 28
                    END IF
            END IF
            CALL SP_OPEN_OLD (STUN,'#'//STFILE(1:LENGTH),IERR)
            CALL SP_RETCODE (IERR)
            CALL SP_GET_HEADER (STUN,HEADER,IERR)
            CALL SP_RETCODE (IERR)
            LPC=SD_ORDRLPC IF (IFORM(4) .LE. 0) THEN ! external bits for LPC parameters.
                    DO I = 1, 2*LPC
                            READ (LUN, *) IFORM(5+I)
                    END DO
            END IF
            CLOSE (UNIT=LUN)
            LPCD = 0
            ICPTR(2,2)=ICPTR(2,1)
            ICPTR(4,2)=ICPTR(4,1)
            IFORM(2) = LPC_PARAM
            IFORM(4) = LPC_BITS CALL GET_STRING ('Input file with data (Def: DATA1:MRKV.DAT)',
        1                                                INFILE, LENGTH)
            IF (LENGTH .EQ. 0) THEN
                    INFILE = 'DATA1:[SPCH.PANOS.MARKOV]MRKV.DAT'
                    LENGTH = 33
            END IF CALL SP_OPEN_OLD (LUN,'#'//INFILE(1:LENGTH),IERR)
            CALL SP_RETCODE (IERR)

CALL SP_READ (LUN,1,1, 400, IDIDNT, IPTR,IERR)
            CALL SP_RETCODE (IERR)

! Set up offset indices for Markov array / transition matrix.

IOFF(1) = 0
            IOFF1(1) = 0
            IOFF2(1) = 0
            DO I = 2, NPARAM
                    NLEVELS(I-1) = 2**ICPTR1(2*I-2, 1)
```

```
                IOFF(I) = IOFF(I-1) + NLEVELS(I-1)**2
                NLEVELS1 = NLEVELS(I-1)
                IOFF2(I) = IOFF2(I-1) + NLEVELS1**3
                IOFF1(I) = IOFF1(I-1) + NLEVELS(I-1)
        END DO
        NLEVELS(NPARAM) = 2**ICPTR1(2*NPARAM, 1)
        NWDWANT = IOFF(NPARAM) + NLEVELS(NPARAM)**2

! Create array with Huffman word lengths.

IF (IHUFF_TAB .GE. 0) THEN  ! 1st order Markov
                CALL SP_READ (LUN, 1, 401, 2*NWDWANT, IDIDNT, MRV1,IERR)
                CALL SP_RETCODE (IERR)
        ELSE ! 2nd order Markov
                NLEVELS1 = NLEVELS(NPARAM)
                NWDWANT1 = IOFF2(NPARAM) + NLEVELS1**3
                CALL SP_READ (LUN,1,401+2*NWDWANT,2*NWDWANT1,IDIDNT, MRV1,IERR)
                CALL SP_RETCODE (IERR)
        END IF

CALL SP_CLOSE (LUN,IERR)
        CALL SP_RETCODE (IERR)

CALL HUFFMTRX (MRV, IHUFF, NLEVELS, NPARAM, AVBTS, LNG_NO_MRKV,
     1                                          AVBTS_NO_MRKV, IHUFF_TAB)
C
C*****************************************************************************
C       CREATE ENCODING / DECODING TABLES
C*****************************************************************************
C
        STEP(3)=1.5*16./2.**ICPTR(2,1)   ! Step for energy
        CALL CDTABLES (LPC,LPCD,STUN,ICPTR,CODE,DECODE,IFORM,STEP)
        CALL SP_CLOSE (STUN,IERR)
        CALL SP_RETCODE (IERR)
        DO J = 1, IVUV_TAB
        DO I = 1, 100
                IF (ICPTR(I,J) .NE. ICPTR1(I,J)) STOP 'ICPTR'
        END DO
        END DO ! Convert the tables to tables for K-parameters DO IVU = 1, IVUV_TAB
                NNTOT = ICPTR(2*LPC+3,IVU) + 2**(ICPTR(2*LPC+4,IVU)) + 1 -
     1                                          ICPTR(5,IVU)
                IF (IFORM(2) .EQ. 20) THEN
                        DO I = ICPTR(5,IVU)+1, ICPTR(5,IVU)+NNTOT
                                CODE(I,IVU) = SIN (CODE(I,IVU))
                                DECODE(I,IVU) = SIN (DECODE(I,IVU))
                        END DO
                ELSE IF (IFORM(2) .EQ. 19) THEN
                        CALL LAR_TO_K (CODE(ICPTR(5,IVU)+1,IVU), NNTOT,
     1                                          CODE(ICPTR(5,IVU)+1,IVU))
                        CALL LAR_TO_K (DECODE(ICPTR(5,IVU)+1,IVU), NNTOT,
     1                                          DECODE(ICPTR(5,IVU)+1,IVU))
                DO J = 1, LPC  ! rearrange the arrays in ascending order.
                        NPOINTS = 2**(ICPTR(2*J+4,IVU))
                        IFIRST = ICPTR(2*J+3,IVU)
                        ILAST = IFIRST + NPOINTS + 1
                        CODE(IFIRST+NPOINTS/2+1,IVU) =
     1                          AINT (CODE(IFIRST+NPOINTS/2+1,IVU)*32768.)
                        DO I = 1, NPOINTS/2
                                CODE(IFIRST+I,IVU) =
     1                                  AINT (CODE(IFIRST+I,IVU)*32768.)
                                CODE(ILAST+1-I,IVU) =
     1                                  AINT (CODE(ILAST+1-I,IVU)*32768.)
                                DECODE(IFIRST+I,IVU) =
     1                                  AINT (DECODE(IFIRST+I,IVU)*32768.)
                                DECODE(ILAST-I,IVU) =
     1                                  AINT (DECODE(ILAST-I,IVU)*32768.)
                                STORE = CODE(IFIRST+I,IVU)
                                CODE(IFIRST+I,IVU) = CODE(ILAST+1-I,IVU)
```

```
                            CODE(ILAST+1-I,IVU) = STORE
                            STORE = DECODE(IFIRST+I,IVU)
                            DECODE(IFIRST+I,IVU) = DECODE(ILAST-I,IVU)
                            DECODE(ILAST-I,IVU) = STORE
                        END DO
                    END DO
                END IF
            END DO

! Open output file with average bit rates

CALL GET1_STRING ('Output file with bit rate (def: no outfile)',
        1                        STFILE, LENGTH)
            IF (LENGTH .EQ. 0) THEN
                    OUTSTAT = .FALSE.
            ELSE
                    OPEN (UNIT=STUN, NAME=STFILE, TYPE='NEW')
                    WRITE (STUN, 100) (CPARAM(I), I=1,LPC+3), (ICPTR(2*I,1),
        1               I=1,LPC+2), LPC_BITS+ICPTR(2,1)+ICPTR(4,1),
        2                           (AVBTS(I), I=1,LPC+3)
100             FORMAT (20X, 2(A, 1X), <LPC>A, 2X, A//8X, 'ASSIGNED', 4X,
        1               2(1X,I1,2X), 2X, <LPC>(I1,3X), 1X, I2//
        2           1X,'MRKV-HUFF STATIST',2X,2F4.1,1X,<LPC>F4.1,1X,F5.1/)
            END IF
C
C****************************************************************
C       OPEN ANALYSIS FILES
C****************************************************************
C
            INFR = 0         ! counter of coded and output frames.
            CALL CLEAR (NBITS(1), 2*NPARAM)
            CALL CLEAR (NBITS1(1), 2*NPARAM)

XMIN = NPARAM
            CALL HISTINIT (FHIST, 139, 1.0, 44.0, XMIN, XMAX, 1)

120         CALL GET1_STRING ('Input analysis file (@file=filelist)',
        1                                       INFILE,LENGTH1)
            IF (LENGTH1.EQ.0) GO TO 120

IF (INFILE(1:1) .EQ. '@') THEN  ! list of input files
                    INLIST = .TRUE.
                    INFILE(1:79) = INFILE (2:80)
                    LENGTH1 = LENGTH1 - 1
                    OPEN (UNIT=IUN1, NAME=INFILE, TYPE='OLD')
                    CALL GET1_STRING ('Output analysis filelist (def=no output)',
        1                               OUTFILE, LENGTH2)
                    IF (LENGTH2 .EQ. 0) OUTPUT = .FALSE.
                    IF (OUTPUT) THEN
                            OPEN (UNIT=IUN2, NAME=OUTFILE, TYPE='OLD')
                            OUTLIST = .TRUE.
                    END IF
            ELSE
                    CALL GET1_STRING ('Output file (def=no output)',
        1                               OUTFILE, LENGTH2)
                    IF (LENGTH2 .EQ. 0) OUTPUT = .FALSE.
            END IF 140         IF (INLIST) READ (IUN1, 160, END=700) LENGTH1, INFILE
160         FORMAT (Q,A)
            IF (INLIST .AND. OUTLIST) READ (IUN2, 160, IOSTAT=IOS) LENGTH2, OUTFILE
            IF (INLIST .AND. (.NOT.OUTLIST .OR. (OUTLIST .AND. IOS.LT.0))) THEN
                    II = INDEX (INFILE, '.LPC')
                    OUTFILE = INFILE(1:II)//'LPQ'
                    LENGTH2 = LENGTH1
            END IF CALL SP_OPEN_OLD (INUN,'#'//INFILE(1:LENGTH1),IERR)
            CALL SP_RETCODE (IERR)
            CALL SP_GET_HEADER (INUN,HEADER,IERR)
            CALL SP_RETCODE (IERR)
            NUMFR=SP_NUMFRAMES
```

```
        FRPRD = SP_FRPERIOD
        ISAMPD=SD_SAMPERIOD
        IDATATP=SD_DATATYPE
        CALL DOUBLE (SD_NAME(1),%REF(NAME),4)
        CALL DOUBLE (SD_DESCR(1),%REF(NDESCR),39)
        IF (OUTPUT) THEN
                CALL SP_OPEN_NEW ('#'//OUTFILE(1:LENGTH2),NAME,IDATATP,ISAMPD,
    1                            NDESCR,OUTUN,NEWID,IERR)
                CALL SP_RETCODE (IERR)
                CALL SP_PUT_HEADER (OUTUN,HEADER,IERR)
                CALL SP_RETCODE (IERR)
        END IF

C
C*********************************************************************
C       INPUT REFLECTION COEFFICIENTS
C*********************************************************************
C
        CALL CLEAR (NBITSF(1), 2*NPARAM)
        CALL CLEAR (NBITS1F(1), 2*NPARAM)
        IINFR = 0
        LFRAME=LPC+2
        NFRAME=LFRAME
        ISIL = 0
        MAXEGY = 0
        DO I = 1, LPC+2
                IQLEV(I) = NLEVELS(I) / 2
                IQLEV1(I) = NLEVELS(I) / 2
        END DO
C
        DO 500 NFR=1,NUMFR
        CALL SP_READ (INUN,LFRAME,NFR,NFRAME,IDIDNT,INPARAM,IERR)
        CALL SP_RETCODE (IERR)

DO 200 I=1,LPC+2
                RC(I) = INPARAM(I)
200     CONTINUE
        IF (INPARAM(1).EQ.1 .OR. (INPARAM(1).LE.3 .AND. INPARAM(2).EQ.0))
    1                                                   THEN ! silence
                DO I = 1, LPC+2
                        RC(I) = 0.
                END DO
                GO TO 400
        END IF IVU = 1 ! voiced frame or unified tables
        IF (INPARAM(2).EQ.0 .AND. IVUV_TAB.EQ.2) IVU=2 ! UNVOICED FRAME C
! LPC parameter coding FRM_LONG = 0 ! Total bits fot this frame.
        DO I=1,LPC+2
                IF (IHUFF_TAB .GE. 0) THEN ! 1st order Markov
                        INDX = IOFF(I) + NLEVELS(I) * (IQLEV(I)-1)
                ELSE ! 2nd order Markov
                        INDX = IOFF2(I) + NLEVELS(I) * (IQLEV(I)-1) +
    1                                    (IQLEV1(I)-1) * NLEVELS(I)**2
                END IF
                CALL CODER (RC(I), CODE(ICPTR(2*I-1,IVU)+1, IVU),
    1                                       ICPTR(2*I,IVU), ICODE)
                NBITSF(I) = NBITSF(I) + IHUFF(INDX+ICODE)
                FRM_LONG = FRM_LONG + IHUFF(INDX+ICODE)
                NBITS1F(I) = NBITS1F(I) + LNG_NO_MRKV(IOFF1(I)+ICODE)
                IQLEV1(I) = IQLEV(I)
                IQLEV(I) = ICODE
        END DO
        CALL HIST (FRM_LONG, FHIST)
        IINFR = IINFR + 1
C
C
        IF (OUTPUT) THEN
                DO I = 1, LPC+2
```

```
                                  OUTPARAM(I) = NINT
        1                             (DECODE(ICPTR(2*I-1,IVU)+IQLEV(I), IVU))
             END DO
        END IF
C
C
C
C***********************************************************************
C                         OUTPUT QUANTIZED PARAMETERS
C***********************************************************************
C
400     IF (OUTPUT) THEN
                CALL SP_WRITE (OUTUN,LFRAME,NFR,NFRAME,OUTPARAM,IERR)
                CALL SP_RETCODE (IERR)
        END IF
500     CONTINUE

CLOSE (UNIT=13)
        CALL SP_CLOSE (INUN,IERR)
        CALL SP_RETCODE (IERR)
        IF (OUTPUT) THEN
                CALL SP_CLOSE (OUTUN,IERR)
                CALL SP_RETCODE (IERR)
        END IF
        INFR = INFR + IINFR
        AF(LPC+3) = 0.
        DO I = 1, LPC+2
                NBITS(I) = NBITS(I) + NBITSF(I)
                AF(I) = FLOAT(NBITSF(I)) / FLOAT(IINFR)
                AF(LPC+3) = AF(LPC+3) + AF(I)
                NBITS1(I) = NBITS1(I) + NBITS1F(I)
        END DO
        IF (OUTSTAT) WRITE (STUN, 540) NAME, (AF(I), I=1,LPC+3)
540     FORMAT (3X, 'FILE ', A8, 4X, 2F4.1, 1X, <LPC>F4.1, 1X, F5.1)
        IF (INLIST) GO TO 140

700     IF (INLIST) THEN
                CLOSE (IUN1)
                IF (OUTLIST) CLOSE (IUN2)
        END IF

! Write out statistics

IF (OUTSTAT) THEN
                A(LPC+3) = 0.
                DO I = 1, LPC+2
                        A(I) = FLOAT(NBITS(I)) / FLOAT(INFR)
                        A(LPC+3) = A(LPC+3) + A(I)
                        A1(I) = FLOAT(NBITS1(I)) / FLOAT(INFR)
                        A1(LPC+3) = A1(LPC+3) + A1(I)
                END DO
                WRITE (STUN, 740) (A(I), I=1,LPC+3),
        1               (AVBTS_NO_MRKV(I), I=1,LPC+3), (A1(I), I=1,LPC+3)
740             FORMAT(1X/1X,'MRKV-HUFF ACTUAL',3X,2F4.1,1X,<LPC>F4.1,1X,F5.1//
        1               1X,'ONLY HUFF STATIST', 2X,2F4.1,1X,<LPC>F4.1,1X,F5.1/
        1               1X, 'ONLY HUFF ACTUAL', 3X,2F4.1,1X,<LPC>F4.1,1X,F5.1)

! Average frame length with extra bit to flag frame =< or > 48 bits long.

AVBTS1 = 0
                DO I = FHIST(10), FHIST(11)
                        II = I - FHIST(10)
                        IF (I .LE. 48) THEN
                                AVBTS1 = AVBTS1 + (I+1) * FHIST(II+12)
                        ELSE
                                AVBTS1 = AVBTS1 + 49 * FHIST(II+12)
                        END IF
                END DO
                AVBTS1 = AVBTS1 / FHIST(6)

CALL HISTWRAP (FHIST)
```

```
              WRITE (STUN, 760) AVBTS1, (FHIST(I), I=1,4)
760           FORMAT (///10X, 'Av. frame length with flag for 48 bit long fram
     1                F5.1//10X, 'Distribution of frame lengths in bits'/
     1                10x, 'Minimum length = ',F5.1, 5X, 'Maximum length = ',
     2                F6.1/10x, 'Mean length = ', F5.1, 5x,
     3                'Standard deviation = ', f5.1)
              WRITE (STUN, 780) FHIST(7)
780           FORMAT (///10X, 'Histogram of frame lengths'//
     1                10x, 'Min value = ',f5.1/)
              DO I = 9, INT(FHIST(5))+8
                    IILL = 500. * FHIST(I)
                    IF (IILL .EQ. 0) THEN
                            WRITE (STUN, *)
                    ELSE
                            WRITE (STUN, 800)
800                         FORMAT (10X, <IILL>('*'))
                    END IF
              END DO
              WRITE (STUN, 820) FHIST(8)
820           FORMAT (/10x, 'Max value = ',f5.1/)
              CLOSE (UNIT=STUN)
        END IF STOP
C
C
        END
        PROGRAM MRKVPROC
C
C*******************************************************************************
C       Program to process the results of the transition matrix computation
C       for the Markov model of the LPC parameters.
C       This program basically prints out on a file the transision matrices
C       of first order.  It also prints out the corresponding matrices of
C       Huffman codeword lengths.
C*******************************************************************************
C
        PARAMETER (MAX_LEV=128)
        PARAMETER (NPARAM=12)

CHARACTER*78 INFILE
        CHARACTER CPARAM(NPARAM)*4

INTEGER*2 MRV1(999999)
        INTEGER*2 IHUFF(499999)
        INTEGER*2 IQLEV(NPARAM, 3), IPTR(400), IARRAY(MAX_LEV)
        INTEGER*2 STUN, INUN
        INTEGER*2 NLEVELS(NPARAM)
        INTEGER*2 IDUM(NPARAM*MAX_LEV)

INTEGER*4 MRV(499999)
        INTEGER*4 IOFF(NPARAM)
        INTEGER*4 ICPTR(100,2),IFORM(30)

DIMENSION AA(NPARAM+2), AA1(NPARAM+2)

EQUIVALENCE (IPTR(1), ICPTR(1,1))
        EQUIVALENCE (MRV1(1), MRV(1))

DATA CPARAM/'ENGY','PTCH','K1 ','K2 ','K3 ','K4 ','K5 ',
     1              'K6 ','K7 ','K8 ','K9 ','K10 '/

INUN = 1
        STUN = 2
        IMRKV = 1

80      CALL GET_STRING ('Input file with data (Def: DATA1:MRKV.DAT)',
     1                                        INFILE, LENGTH)
        IF (LENGTH .EQ. 0) THEN
                INFILE = 'DATA1:[SPCH.PANOS.MARKOV]MRKV.DAT'
                LENGTH = 33
        END IF
```

```
        CALL SP_OPEN_OLD (INUN,'#'//INFILE(1:LENGTH),IERR)
        CALL SP_RETCODE (IERR)

CALL SP_READ (INUN,1,1, 400, IDIDNT, IPTR,IERR)
        CALL SP_RETCODE (IERR)

100     CALL GET_I4 ('0=exit, 1=1st order Markov, 2=2nd order Markov',
       1                                                  1,IMRKV)
        IF (IMRKV.LT.0 .OR. IMRKV.GT.2) GO TO 100
        IF (IMRKV .EQ. 0) GO TO 300
120     CALL GET_STRING ('Output file with transition matrix',
       1                                                  INFILE, LENGTH)
        IF (LENGTH .EQ. 0) GO TO 120
        OPEN (UNIT=STUN, NAME=INFILE(1:LENGTH), TYPE='NEW')

! First order Markov

IF (IMRKV .EQ. 1) THEN

! Set up offset indices for Markov array / transition matrix.

IOFF(1) = 0
            DO I = 2, NPARAM
                NLEVELS(I-1) = 2**ICPTR(2*I-2, 1)
                IOFF(I) = IOFF(I-1) + NLEVELS(I-1)**2
            END DO
            NLEVELS(NPARAM) = 2**ICPTR(2*NPARAM, 1)
            NWDWANT = IOFF(NPARAM) + NLEVELS(NPARAM)**2

CALL SP_READ (INUN, 1, 401, 2*NWDWANT, IDIDNT, MRV1,IERR)
            CALL SP_RETCODE (IERR)

CALL SP_CLOSE (INUN,IERR)
            CALL SP_RETCODE (IERR)

CALL GET_I4
       1    ('Type: 1=regular coding, 2=combined tables, 3=1 row/matrix',
       2                                                  1, IHUFF_TAB)
            CALL HUFFMTRX (MRV,IHUFF,NLEVELS,NPARAM,AA,IDUM,AA1, IHUFF_TAB)

! Write out tables

DO IPARAM = 1, NPARAM
                WRITE (STUN, 140) CPARAM(IPARAM),
       1                                   (I, I=1,NLEVELS(IPARAM))
140             FORMAT ('1',6X,'First order Markov transition matrix'/
       1                   6X,'Parameter: ',A//6X, <NLEVELS(IPARAM)>I3/)
                DO IROW = 1, NLEVELS(IPARAM)
                    ISUM = 0
                    INDEX = IOFF(IPARAM) + (IROW-1) * NLEVELS(IPARAM)
                    DO I = 1, NLEVELS(IPARAM)
                        ISUM = ISUM + MRV(INDEX+I)
                    END DO
                    IF (ISUM .EQ. 0) ISUM = 1
                    DO I = 1, NLEVELS(IPARAM)
                        IARRAY(I) = NINT (MRV(INDEX+I) *
       1                                             100. / ISUM)
                    END DO
                    WRITE (STUN, 160) IROW, (IARRAY(I), I=1,
       1                                   NLEVELS(IPARAM)), ISUM
160                 FORMAT (1X, I3, 2X, <NLEVELS(IPARAM)>I3, 2X, I5)
                END DO
            END DO
            DO IPARAM = 1, NPARAM
                WRITE (STUN, 180) CPARAM(IPARAM),
       1                                   (I, I=1,NLEVELS(IPARAM))
180             FORMAT ('1',6X,'Codeword lenghts for Huffman coding'/
       1                   6X,'Parameter: ',A//6X, <NLEVELS(IPARAM)>I3/)
                DO IROW = 1, NLEVELS(IPARAM)
                    INDEX = IOFF(IPARAM) + (IROW-1) * NLEVELS(IPARAM)
                    WRITE (STUN, 200) IROW, (IHUFF(INDEX+I), I=1,
```

```
200                     FORMAT (1X, I3, 2X, <NLEVELS(IPARAM)>I3)
              END DO
                        WRITE (STUN, 220) AA(IPARAM)
220                     FORMAT (//6X, 'Average bits for this parameter: ',F5.2)
              END DO ! Second order Markov

ELSE IF (IMRKV .EQ. 2) THEN

! Set up offset indices for Markov array / transition matrix.

IHUFF_TAB = -1
              IFF = 0
              IOFF(1) = 0
              DO I = 2, NPARAM
                    NLEVELS(I-1) = 2**ICPTR(2*I-2, 1)
                    NLEVELS1 = NLEVELS(I-1)
                    IOFF(I) = IOFF(I-1) + NLEVELS1**3
                    IFF = IFF + NLEVELS(I-1)**2
              END DO
              NLEVELS(NPARAM) = 2**ICPTR(2*NPARAM, 1)
              NLEVELS1 = NLEVELS(NPARAM)
              NWDWANT = IOFF(NPARAM) + NLEVELS1**3
              IFF = IFF + NLEVELS(NPARAM)**2 + 401

CALL SP_READ (INUN, 1, IFF, 2*NWDWANT, IDIDNT, MRV1,IERR)
              CALL SP_RETCODE (IERR)

CALL SP_CLOSE (INUN,IERR)
              CALL SP_RETCODE (IERR)

CALL HUFFMTRX (MRV, IHUFF, NLEVELS, NPARAM, AA, IDUM, AA1, IHUFF

! Write out tables

CALL GET_I4 ('Parameter: 1=egy, 2=ptch, 3-12=LPC+2', 3, IPARAM)
              WRITE (STUN, 240) CPARAM(IPARAM), (I, I=1,NLEVELS(IPARAM))
240           FORMAT (7X,'Second order Markov transition matrix'/
     1                7X,'Parameter: ',A//10X, <NLEVELS(IPARAM)>I3)
              DO IROW1 = 1, NLEVELS(IPARAM)
                    WRITE (STUN, *)
              DO IROW2 = 1, NLEVELS(IPARAM)
                    ISUM = 0
                    INDEX = IOFF(IPARAM) + (IROW1-1) * NLEVELS(IPARAM)**2
     1                           + (IROW2-1) * NLEVELS(IPARAM)
                    DO ICOL = 1, NLEVELS(IPARAM)
                          ISUM = ISUM + MRV(INDEX+ICOL)
                    END DO
                    IF (ISUM .EQ. 0) ISUM = 1
                    DO I = 1, NLEVELS(IPARAM)
                          IARRAY(I) = NINT (MRV(INDEX+I) * 100. / ISUM)
                    END DO
                    WRITE (STUN, 260) IROW1, IROW2, (IARRAY(I),I=1,
     1                                    NLEVELS(IPARAM)), ISUM
260                 FORMAT (1X, '(',I2,',',I2,')', 2X, <NLEVELS(IPARAM)>I3,
     1                                    2X, I5)
              END DO WRITE (STUN, 280) CPARAM(IPARAM), (I, I=1,NLEVELS(IPARAM))
280           FORMAT ('1',7X,'Second order Markov: Huffman codewords'/
     1                7X,'Parameter: ',A//10X, <NLEVELS(IPARAM)>I3)
              DO IROW1 = 1, NLEVELS(IPARAM)
                    WRITE (STUN, *)
              DO IROW2 = 1, NLEVELS(IPARAM)
                    INDEX = IOFF(IPARAM) + (IROW1-1) * NLEVELS(IPARAM)**2
     1                           + (IROW2-1) * NLEVELS(IPARAM)
                    WRITE (STUN, 290) IROW1, IROW2, (IHUFF(INDEX+I),I=1,
     1                                    NLEVELS(IPARAM))
290                 FORMAT (1X, '(',I2,',',I2,')', 2X, <NLEVELS(IPARAM)>I3)
              END DO
              END DO
        END IF
```

```
        CLOSE (STUN)
300     STOP

END
        PROGRAM MHCODE
C
C*****************************************************************
C       This progran inputs analyzed speech and discards silence.
C       The LPC parameters are then quantized and the first
C       order transitional probabilities of a Markov model are computed.
C
C          STRUCTURE OF DATA FILE (FREE FORMATED):
C               Linear(1), Max entropy(2), Min deviation(3) Quant.
C               Energy bits/frame
C               Pitch bits/frame
C               Flag: <= 0 externally assigned bits for param
C               LPC parameters: RC(18), LAR(19), ASIN(20)
C               LPC encoding bits/frame
C               Flag: 1=regular Huffman, 2=combined tables, 3=1 row per matrix
C               Flag: 1=Unified tables, 2=Separate V-UV tables.
C
C       NOTE: If a frame has energy < 1, it is considered silence;
C             It is also considered silence if it is unvoiced
C             (pitch=0) and has energy < 3.
C*****************************************************************
C
        PARAMETER (MAX_LEV=128)
        PARAMETER (NPARAM=12)

DIMENSION CODE(10000,2),DECODE(10000,2)
        DIMENSION ICPTR(100,2),ICPTR1(100,2), IFORM(12)
        DIMENSION AF(15), A1(15)
        DIMENSION PITCHEN(2), FHIST(140)
        DIMENSION AVBTS(NPARAM+1), AVBTS_NO_MRKV(NPARAM+1)
        DIMENSION SPEECH(512),RC(20),A(20), STEP(10)

INTEGER*2 LNG_NO_MRKV(NPARAM*MAX_LEV)
        INTEGER*2 IHUFF(499999)
        INTEGER*2 IPTR(400), NLEVELS(NPARAM)
        INTEGER*2 INUN,OUTUN
        INTEGER*2 LFRAME, NFACTR,ISAMPD,IDATATP,LENGTH
        INTEGER*2 STUN, ISPEECHUN, IERR, IFRAME, NSAMP, ISAMP
        INTEGER*2 NSPRD, IDATATYP
        INTEGER*2 INSPEECH(512),IREAL(2)
        INTEGER*2 IQLEV(NPARAM, 3)
        INTEGER*2 INPARAM(NPARAM)

INTEGER*4 MRV(499999)
        INTEGER*4 IOFF(NPARAM), IOFF1(NPARAM), IOFF2(NPARAM)
        INTEGER*4 NBITS(NPARAM), NBITS1(NPARAM)
        INTEGER*4 NBITSF(NPARAM), NBITS1F(NPARAM)

CHARACTER CPARAM(NPARAM+1)*4
        CHARACTER*80 STFILE,INFILE,OUTFILE,INF1,OUTF1
        CHARACTER*78 NDESCR
        CHARACTER*8 NAME,LABEL
        CHARACTER*78 INSPCH,INSTAT

LOGICAL*2 INLIST
        INCLUDE 'UD:[PANOS.ROOTS]HEADER.FRM'
C
C*****************************************************************
C       INPUT ENCODING DATA
C*****************************************************************
C
        INLIST = .FALSE.
        STUN = 1
        LUN = 2
        IFILE=3
```

```
              ISPEECHUN = 4
              INUN = 9
              IUN1 = 7
              IUN2 = 8
              NWDWANT = 499999

CALL CLEAR (MRV(1), 2*NWDWANT)
C
C       QUANTIZATION FILE
C
              CALL GET1_STRING ('Parameter file (Default: MRKVHUFF.DAT)',
     1                                              STFILE,LENGTH)
              IF (LENGTH.EQ.0) THEN
                      STFILE = 'UD:[PANOS.PROJECT]MRKVHUFF.DAT'
                      LENGTH = 30
              END IF
              OPEN (UNIT=LUN,NAME=STFILE,TYPE='OLD')
              READ (LUN,*) IFORM(1)    ! Linear(1), Max entr.(2), Min dev.(3) Quant.
              READ (LUN,*) ICPTR(2,1)  ! Energy bits/frame
              READ (LUN,*) ICPTR(4,1)  ! Pitch bits/frame
              READ (LUN,*) IFORM(4)    ! Flag:<=0 ext. bits for param
              READ (LUN,*) LPC_PARAM   ! LPC parameters: RC(18), LAR(19), ASIN(20)
              READ (LUN,*) LPC_BITS    ! LPC encoding bits/frame
              READ (LUN,*) IHUFF_TAB   ! Flag: 1=regular Huffman, 2=combined tables
                                       ! 3=collapse matrix in a row
              IF (IHUFF_TAB.LT.1 .OR. IHUFF_TAB.GT.3) IHUFF_TAB = 1
              READ (LUN,*) IVUV_TAB    ! Flag: 1=Unified tables, .=separate V-UV tab
              IF (IVUV_TAB. NE. 1) IVUV_TAB = 2
              IFORM(5) = 10 * IVUV_TAB + IFORM(5)
              IF (IFORM(4) .LE. 0) THEN ! external bits for LPC parameters.
                      DO I = 1, 2*LPC
                              READ (LUN, *) IFORM(5+I)
                      END DO
              ELSE
                      IFORM(4) = LPC_BITS
              END IF
              CLOSE (UNIT=LUN)
              IFORM(2) = LPC_PARAM
              IFORM(5) = 101 + IVUV_TAB * 10
C
C       STATISTICS FILE
C
              IF (IVUV_TAB .EQ. 2) THEN ! seperate tables.
                      STFILE = 'UD:[PANOS.ROOTS]ROOT500A.DAT'
                      LENGTH = 28
              ELSE IF (IVUV_TAB .EQ. 1) THEN ! unified tables
                      STFILE = 'UD:[PANOS.ROOTS]ROOT500C.DAT'
                      LENGTH = 28
              END IF
              CALL SP_OPEN_OLD (STUN,'#'//STFILE(1:LENGTH),IERR)
              CALL SP_RETCODE (IERR)
              CALL SP_GET_HEADER (STUN,HEADER,IERR)
              CALL SP_RETCODE (IERR)
              LPC=SD_ORDRLPC C
C***********************************************************************
C       CREATE ENCODING / DECODING TABLES
C***********************************************************************
C
              STEP(3)=1.5*16./2.**ICPTR(2,1)   ! Step for energy
              CALL CDTABLES (LPC,LPCD,STUN,ICPTR,CODE,DECODE,IFORM,STEP)
              CALL SP_CLOSE (STUN,IERR)
              CALL SP_RETCODE (IERR)

! Set up offset indices for Markov array / transition matrix.

IOFF(1) = 0
              IOFF1(1) = 0
              DO I = 1, NPARAM-1
                      NLEVELS(I) = 2**ICPTR(2*I, 1)
                      IOFF(I+1) = IOFF(I) + NLEVELS(I)**2
```

```
              IOFF1(I+1) = IOFF1(I) + NLEVELS(I)
        END DO
        NLEVELS(NPARAM) = 2**ICPTR(2*NPARAM, 1)

! Convert the tables to tables for K-parameters

DO IVU = 1, IVUV_TAB
                NNTOT = ICPTR(2*LPC+3,IVU) + 2**(ICPTR(2*LPC+4,IVU)) + 1 -
       1                                                ICPTR(5,IVU)
                IF (IFORM(2) .EQ. 20) THEN
                        DO I = ICPTR(5,IVU)+1, ICPTR(5,IVU)+NNTOT
                                CODE(I,IVU) = SIN (CODE(I,IVU))
                                DECODE(I,IVU) = SIN (DECODE(I,IVU))
                        END DO
                ELSE IF (IFORM(2) .EQ. 19) THEN
                        CALL LAR_TO_K (CODE(ICPTR(5,IVU)+1,IVU), NNTOT,
       1                                       CODE(ICPTR(5,IVU)+1,IVU))
                        CALL LAR_TO_K (DECODE(ICPTR(5,IVU)+1,IVU), NNTOT,
       1                                       DECODE(ICPTR(5,IVU)+1,IVU))
                    DO J = 1, LPC ! rearrange the arrays in ascending order.
                        NPOINTS = 2**(ICPTR(2*J+4,IVU))
                        IFIRST = ICPTR(2*J+3,IVU)
                        ILAST = IFIRST + NPOINTS + 1
                        CODE(IFIRST+NPOINTS/2+1,IVU) =
       1                        AINT (CODE(IFIRST+NPOINTS/2+1,IVU)*32768.)
                        DO I = 1, NPOINTS/2
                                CODE(IFIRST+I,IVU) =
       1                                AINT (CODE(IFIRST+I,IVU)*32768.)
                                CODE(ILAST+1-I,IVU) =
       1                                AINT (CODE(ILAST+1-I,IVU)*32768.)
                                DECODE(IFIRST+I,IVU) =
       1                                AINT (DECODE(IFIRST+I,IVU)*32768.)
                                DECODE(ILAST-I,IVU) =
       1                                AINT (DECODE(ILAST-I,IVU)*32768.)
                                STORE = CODE(IFIRST+I,IVU)
                                CODE(IFIRST+I,IVU) = CODE(ILAST+1-I,IVU)
                                CODE(ILAST+1-I,IVU) = STORE
                                STORE = DECODE(IFIRST+I,IVU)
                                DECODE(IFIRST+I,IVU) = DECODE(ILAST-I,IVU)
                                DECODE(ILAST-I,IVU) = STORE
                        END DO
                    END DO
                END IF
        END DO 100     CALL GET1_STRING
       1        ('Input spch filename (@file= list, Def:NAMEFILE.DAT)',
       2                                                INSPCH, LENGTH)
        IF (LENGTH.NE.0) THEN
                IF (INSPCH(1:1) .NE. '@') GO TO 160
                INLIST = .TRUE.
                OPEN (UNIT=IFILE, NAME=INSPCH(2:), TYPE='OLD')
        ELSE
                INLIST = .TRUE.
                OPEN (UNIT=IFILE,
       1                NAME='UD:[PANOS.ROOTS]NAMEFILE.DAT',TYPE='OLD')
        END IF
140     FORMAT (Q,A)
150     READ (IFILE, 140, END=400) LENGTH, INSPCH
160     CALL SP_OPEN_OLD (ISPEECHUN,'#'//INSPCH(1:LENGTH),IERR)
        CALL SP_RETCODE (IERR)
        CALL SP_GET_HEADER (ISPEECHUN,HEADER,IERR)
        CALL SP_RETCODE (IERR)
        CALL DOUBLE (SD_NAME(1),%REF(NAME),4)
        CALL DOUBLE (SD_DESCR(1),%REF(NDESCR),39)

NUMFR = SP_NUMFRAMES
        LFRAME = LPC + 2
        NFRAME = LFRAME
C
```

```
C*******************************************************************
C       INPUT SPEECH DATA
C*******************************************************************
C
        NUMFRAME=0
        DO I = 1, LPC+2
                IQLEV(I,1) = NLEVELS(I) / 2
        END DO
260     NUMFRAME=NUMFRAME+1

IF (NUMFRAME .GT. NUMFR) THEN
                CALL SP_CLOSE (ISPEECHUN, IERR)
                CALL SP_RETCODE (IERR)
                IF (.NOT.INLIST) GO TO 400
                GO TO 150
        END IF
        CALL SP_READ (ISPEECHUN, LFRAME, NUMFRAME, NFRAME, IDIDNT,
     1                      INPARAM, IERR)
        CALL SP_RETCODE (IERR)
        IF ((INPARAM(1).LE.1) .OR. (INPARAM(1).LE.3.AND.INPARAM(2).EQ.
     1                      0)) GO TO 260 ! Discard silence
        IVU = 1
        IF (IVUV_TAB.EQ.2 .AND. INPARAM(1).EQ.0) IVU=2
        DO I = 1, LPC+2
                RC(I) = INPARAM(I)
        END DO
! LPC parameter coding
        DO I=1,LPC+2
                CALL CODER (RC(I), CODE(ICPTR(2*I-1,IVU)+1, IVU),
     1                                      ICPTR(2*I, IVU), ICODE)
                INDEX = IOFF(I) + (IQLEV(I,1)-1) * NLEVELS(I) + ICODE
                MRV(INDEX) = MRV(INDEX) + 1
                IQLEV(I,1) = ICODE
        END DO GO TO 260
C
C
C*******************************************************************
C       INPUT ENCODING DATA
C*******************************************************************
C
400     CALL HUFFMTRX (MRV, IHUFF, NLEVELS, NPARAM, AVBTS, LNG_NO_MRKV,
     1                                  AVBTS_NO_MRKV, IHUFF_TAB)

! Open output file with average bit rates

CALL GET1_STRING ('Output file with bit rate (def: TEMP.DAT)',
     1                  STFILE, LENGTH1)
        IF (LENGTH1 .EQ. 0) THEN
                STFILE = 'UD:[PANOS.PROJECT]TEMP.DAT'
                LENGTH1 = 26
        END IF
        OPEN (UNIT=STUN, NAME=STFILE, TYPE='NEW')
        WRITE (STUN, 420) (CPARAM(I), I=1,LPC+3), (ICPTR(2*I,1),
     1                  I=1,LPC+2), LPC_BITS+ICPTR(2,1)+ICPTR(4,1),
     2                                  (AVBTS(I), I=1,LPC+3)
420     FORMAT (20X, 2(A, 1X), <LPC>A, 2X, A//8X, 'ASSIGNED', 4X,
     1                  2(1X,I1,2X), 2X, <LPC>(I1,3X), 1X, I2//
     2          1X,'MRKV-HUFF STATIST',2X,2F4.1,1X,<LPC>F4.1,1X,F5.1/)
C
C*******************************************************************
C       OPEN ANALYSIS FILES
C*******************************************************************
C
        INFR = 0        ! counter of coded and output frames.
        CALL CLEAR (NBITS(1), 2*NPARAM)
        CALL CLEAR (NBITS1(1), 2*NPARAM)

XMIN = NPARAM
        CALL HISTINIT (FHIST, 139, 1.0, 44.0, XMIN, XMAX, 1)
```

```
              IF (INLIST) REWIND IFILE
440           IF (INLIST) READ (IFILE, 140, END=700) LENGTH, INSPCH

CALL SP_OPEN_OLD (INUN,'#'//INSPCH(1:LENGTH),IERR)
        CALL SP_RETCODE (IERR)
        CALL SP_GET_HEADER (INUN,HEADER,IERR)
        CALL SP_RETCODE (IERR)
        NUMFR=SP_NUMFRAMES
        FRPRD = SP_FRPERIOD
        ISAMPD=SD_SAMPERIOD
        IDATATP=SD_DATATYPE
        CALL DOUBLE (SD_NAME(1),%REF(NAME),4)
        CALL DOUBLE (SD_DESCR(1),%REF(NDESCR),39)

C
C*****************************************************************
C         INPUT REFLECTION COEFFICIENTS
C*****************************************************************
C
        CALL CLEAR (NBITSF(1), 2*NPARAM)
        CALL CLEAR (NBITS1F(1), 2*NPARAM)
        IINFR = 0
        LFRAME=LPC+2
        NFRAME=LFRAME
        ISIL = 0
        DO I = 1, LPC+2
             IQLEV(I,1) = NLEVELS(I) / 2
        END DO
C
        DO 500 NFR=1,NUMFR

CALL SP_READ (INUN,LFRAME,NFR,NFRAME,IDIDNT,INPARAM,IERR)
        CALL SP_RETCODE (IERR)

DO I = 1,LPC+2
             RC(I) = INPARAM(I)
        END DO
        IF (INPARAM(1).LE.1 .OR. (INPARAM(1).LE.3 .AND. INPARAM(2).EQ.0))
     1                                              THEN ! silence
             DO I = 1, LPC+2
                  RC(I) = 0.
             END DO
             GO TO 500
        END IF IVU = 1 ! voiced frame or unified tables
        IF (INPARAM(2).EQ.0 .AND. IVUV_TAB.EQ.2) IVU=2 ! UNVOICED FRAME
C
! LPC parameter coding FRM_LONG = 0 ! Total bits fot this frame.
        DO I=1,LPC+2
             CALL CODER (RC(I), CODE(ICPTR(2*I-1,IVU)+1, IVU),
     1                                      ICPTR(2*I,IVU), ICODE)
             INDX = IOFF(I) + NLEVELS(I) * (IQLEV(I,1)-1) + ICODE
             NBITSF(I) = NBITSF(I) + IHUFF(INDX)
             FRM_LONG = FRM_LONG + IHUFF(INDX)
             NBITS1F(I) = NBITS1F(I) + LNG_NO_MRKV(IOFF1(I)+ICODE)
             IQLEV(I,1) = ICODE
        END DO
        CALL HIST (FRM_LONG, FHIST)
        IINFR = IINFR + 1
C
C
C
C
C*****************************************************************
C                      OUTPUT QUANTIZED PARAMETERS
C*****************************************************************
C
500     CONTINUE
```

```
            CALL SP_CLOSE (INUN,IERR)
            CALL SP_RETCODE (IERR)
            INFR = INFR + IINFR
            AF(LPC+3) = 0.
            DO I = 1, LPC+2
                    NBITS(I) = NBITS(I) + NBITSF(I)
                    AF(I) = FLOAT(NBITSF(I)) / FLOAT(IINFR)
                    AF(LPC+3) = AF(LPC+3) + AF(I)
                    NBITS1(I) = NBITS1(I) + NBITS1F(I)
            END DO
            WRITE (STUN, 540) NAME, (AF(I), I=1,LPC+3)
540         FORMAT (3X, 'FILE ', A8, 4X, 2F4.1, 1X, <LPC>F4.1, 1X, F5.1)
            IF (INLIST) GO TO 440

700         IF (INLIST) CLOSE (IFILE)

! Write out statistics

A(LPC+3) = 0.
            DO I = 1, LPC+2
                    A(I) = FLOAT(NBITS(I)) / FLOAT(INFR)
                    A(LPC+3) = A(LPC+3) + A(I)
                    A1(I) = FLOAT(NBITS1(I)) / FLOAT(INFR)
                    A1(LPC+3) = A1(LPC+3) + A1(I)
            END DO
            WRITE (STUN, 740) (A(I), I=1,LPC+3),
           1              (AVBTS_NO_MRKV(I), I=1,LPC+3), (A1(I), I=1,LPC+3)
740         FORMAT(1X/1X,'MRKV-HUFF ACTUAL',3X,2F4.1,1X,<LPC>F4.1,1X,F5.1//
           1              1X,'ONLY HUFF STATIST', 2X,2F4.1,1X,<LPC>F4.1,1X,F5.1/
           1              1X, 'ONLY HUFF ACTUAL', 3X,2F4.1,1X,<LPC>F4.1,1X,F5.1)

! Average frame length with extra bit to flag frame =< or > 48 bits long.

AVBTS1 = 0
            DO I = FHIST(10), FHIST(11)
                    II = I - FHIST(10)
                    IF (I .LE. 48) THEN
                            AVBTS1 = AVBTS1 + (I+1) * FHIST(II+12)
                    ELSE
                            AVBTS1 = AVBTS1 + 49 * FHIST(II+12)
                    END IF
            END DO
            AVBTS1 = AVBTS1 / FHIST(6)

CALL HISTWRAP (FHIST)
            WRITE (STUN, 760) AVBTS1, (FHIST(I), I=1,4)
760         FORMAT (///10X, 'Av. frame length with flag for 48 bit long frames',
           1              F5.1//10X, 'Distribution of frame lengths in bits'/
           1              10x, 'Minimum length = ',F5.1, 5X, 'Maximum length = ',
           2              F6.1/10x, 'Mean length = ', F5.1, 5x,
           3              'Standard deviation = ', f5.1)
            WRITE (STUN, 780) FHIST(7)
780         FORMAT (///10X, 'Histogram of frame lengths'//
           1              10x, 'Min value = ',f5.1/)
            DO I = 9, INT(FHIST(5))+8
                    IILL = 500. * FHIST(I)
                    IF (IILL .EQ. 0) THEN
                            WRITE (STUN, *)
                    ELSE
                            WRITE (STUN, 800)
800                         FORMAT (10X, <IILL>('*'))
                    END IF
            END DO
            WRITE (STUN, 820) FHIST(8)
820         FORMAT (/10x, 'Max value = ',f5.1/)
            CLOSE (UNIT=STUN)

STOP
C
C
            END
```

```
      SUBROUTINE HUFFMTRX (MRV, IHUFF, NLEVELS, NPARAM, AVBTS, LNG_NO_MRKV,
     1                                        AVBTS_NO_MRKV, IHUFF_TAB)
C
C*****************************************************************************
C      Subroutine to compute the codeword lengths of Huffman code based on
C      a first or second order Markov transition probability matrix.
C      As an output, the average bits per parameter are also given,
C       based on the statistics of the Markov transition matrix.
C
C      MRV: (I*2) Input array with the Markov transition probabilities
C      IHUFF: (I*2) Output array with the codeword lengths
C      NLEVELS: (I*2) Number of levels for each parameter (for offset of MRV)
C      NPARAM: (I*2) Number of parameters considered for coding
C      AVBTS: (R*4) Output array with the average codeword length per param.
C         AVBTS(NPARAM+1)= total average bits / frame.
C      LNG_NO_MRKV: (I*2) Output array with Huffman codeword lengths when no
C             Markov modelling is used.
C      AVBTS_NO_MRKV: (R*4) Output array with the statistical average length
C            of each parameter when no Markov modelling is used.
C      IHUFF_TAB: (I*2) Input flag: 1(def)=use regular Huffman coding matrices
C             of codewords. 2=combine matrices of the same size. 3=collapse
C             each matrix in one row, -1=2nd order Markov-Huffman.
C*****************************************************************************
C
      INTEGER*2 IHUFF(1), IHUFF_TEMP(4096), IBITS(5000)
      INTEGER*2 NLEVELS(1)
      INTEGER*2 NPARAM, IHUFF_TAB
      INTEGER*2 LNG_NO_MRKV(1)

INTEGER*4 MRV(1), MRV_TEMP(4096)

DIMENSION AVBTS(1)
      DIMENSION AVBTS_NO_MRKV(1)
      DIMENSION PROB(512), SUM(50)

IOFF = 0
      IOFF1 = 0
      AVBTS(NPARAM+1) = 0.

IF (IHUFF_TAB .EQ. 2) THEN ! combine matrices of the same size.
          INDEX = 0
          LAST = 0 ! last parameter processed.
          ICOUNT = 1 ! counter for matrices to be added up.
          CALL DOUBLE (MRV(1), MRV_TEMP(1), 2*NLEVELS(1)**2)
          NLEV_CUR = NLEVELS(1)

DO I = 2, NPARAM ! every parameter

IF (NLEVELS(I) .EQ. NLEVELS(I-1)) THEN
                  INDEX = INDEX + NLEVELS(I-1)**2
                  ICOUNT = ICOUNT + 1
                  NLEV_CUR = NLEVELS(I)
                  DO J = 1, NLEVELS(I)**2
                        MRV_TEMP(J) = MRV_TEMP(J) + MRV(INDEX+J)
                  END DO
              END IF

IF ((NLEVELS(I).NE.NLEVELS(I-1)).OR.(I.EQ.NPARAM)) THEN
! Process compound matrix 100                 DO J = 1, NLEV_CUR ! every quant level of previous frame
                        INDEX = (J-1) * NLEV_CUR
                        DO K = 1, NLEV_CUR
                              PROB(K) = MRV_TEMP(INDEX+K)
                        END DO
                        CALL HUFFMAN (PROB, IHUFF(INDEX+IOFF+1), IBITS,
     1                                                   NLEV_CUR, AVB)
                  END DO ! Compute average bits/parameter

DO K = LAST+1, LAST+ICOUNT
```

```
                        III = IOFF + (K-LAST-1) * NLEV_CUR**2
                        SUM1 = 0
                        AVBTS(K) = 0
                        DO L = 1, NLEV_CUR**2
                                AVBTS(K) = AVBTS(K) + IHUFF(IOFF+L) *
     1                                                    MRV(III+L)
                                SUM1 = SUM1 + MRV(III+L)
                        END DO
                        IF (SUM1 .EQ. 0.) SUM1 = 1
                        AVBTS(K) = AVBTS(K) / SUM1
                        AVBTS(NPARAM+1) = AVBTS(NPARAM+1) + AVBTS(K)
                END DO
                LAST = LAST + ICOUNT

! Duplicate the results

DO K = 1, ICOUNT
                        IOFF_SET = IOFF + (K-1) * NLEV_CUR**2
                        CALL DOUBLE (IHUFF(IOFF+1), IHUFF(IOFF_SET+1),
     1                                                   NLEV_CUR**2)
                END DO

IOFF = IOFF + ICOUNT * NLEV_CUR**2
                CALL DOUBLE (MRV(IOFF+1), MRV_TEMP(1), 2*NLEVELS(I)**2)
                ICOUNT = 1
                IF ((I.EQ.NPARAM) .AND. (NLEVELS(I).NE.NLEVELS(I-1))
     1                         .AND. (NLEV_CUR.NE.NLEVELS(I))) THEN
                        NLEV_CUR = NLEVELS(I)
                        GO TO 100
                END IF
                NLEV_CUR = NLEVELS(I)
            END IF
          END DO
        ELSE IF (IHUFF_TAB .EQ. 3) THEN ! collapse each matrix to 1 row.
          DO I = 1, NPARAM ! Compute and process compound row of length 2*NLEVELS(I)-1

IDSPL = NLEVELS(I)
                DO K = 1, NLEVELS(I)
                        IDSPL = IDSPL - 1
                        INDEX = IOFF + (K-1) * NLEVELS(I)
                        DO J = 1, NLEVELS(I)
                            PROB(IDSPL+J) = PROB(IDSPL+J) + MRV(INDEX+J)
                        END DO
                END DO

CALL HUFFMAN (PROB(NLEVELS(I)/2+1),
     1                        IHUFF_TEMP(NLEVELS(I)/2+1), IBITS,
     2                                              NLEVELS(I), AVB)

! Duplicate / shift results.  Compute average bits/parameter.

CALL DOUBLE (IHUFF_TEMP(NLEVELS(I)+1), IHUFF_TEMP(1),
     1                                                NLEVELS(I)/2)
                CALL DOUBLE (IHUFF_TEMP(NLEVELS(I)/2+1),
     1                      IHUFF_TEMP(3*NLEVELS(I)/2+1), NLEVELS(I)/2)
                AVBTS(I) = 0
                SUM1 = 0
                IDSPL = NLEVELS(I)
                DO K = 1, NLEVELS(I)
                        INDEX = IOFF + (K-1) * NLEVELS(I)
                        IDSPL = IDSPL - 1
                        DO J = 1, NLEVELS(I)
                                IHUFF(INDEX+J) = IHUFF_TEMP (IDSPL+J)
                                SUM1 = SUM1 + MRV(INDEX+J)
                                AVBTS(I) = AVBTS(I) + IHUFF(INDEX+J) *
     1                                                    MRV(INDEX+J)
                        END DO
                END DO
                IF (SUM1 .EQ. 0) SUM1 = 1
                AVBTS(I) = AVBTS(I) / SUM1
```

```
                        AVBTS(NPARAM+1) = AVBTS(NPARAM+1) + AVBTS(I)
                        IOFF = IOFF + NLEVELS(I)**2
                END DO
        ELSE IF (IHUFF_TAB .EQ. -1) THEN ! 2nd order Markov
                DO I = 1, NPARAM ! every parameter
                        AVBTS(I) = 0
                        TOT_SUM = 0
                        DO J1 = 1, NLEVELS(I) ! every quant level of previous fr
                        DO J2 = 1, NLEVELS(I) ! every quant level of previous fr
       1                        INDEX = IOFF + (J1-1) * NLEVELS(I)**2 +
                                                (J2-1) * NLEVELS(I)
                                SUM(J) = 0
                                DO K = 1, NLEVELS(I)
                                        PROB(K) = MRV(INDEX+K)
                                        SUM(J) = SUM(J) + PROB(K)
                                END DO
                                TOT_SUM = TOT_SUM + SUM(J)
                                CALL HUFFMAN (PROB, IHUFF(INDEX+1), IBITS,
       1                                        NLEVELS(I), AVB)
                                AVBTS(I) = AVBTS(I) + AVB * SUM(J)
                        END DO
                        END DO
                        AVBTS(I) = AVBTS(I) / TOT_SUM
                        AVBTS(NPARAM+1) = AVBTS(NPARAM+1) + AVBTS(I)
                        NLEVELS1 = NLEVELS(I)
                        IOFF = IOFF + NLEVELS1**3
                END DO
        ELSE ! regular Markov - Huffman coding.
                DO I = 1, NPARAM ! every parameter
                        AVBTS(I) = 0
                        TOT_SUM = 0.
                        DO J = 1, NLEVELS(I) ! every quant level of previous fra
                                INDEX = IOFF + (J-1) * NLEVELS(I)
                                SUM(J) = 0
                                DO K = 1, NLEVELS(I)
                                        PROB(K) = MRV(INDEX+K)
                                        SUM(J) = SUM(J) + PROB(K)
                                END DO
                                TOT_SUM = TOT_SUM + SUM(J)
                                CALL HUFFMAN (PROB, IHUFF(INDEX+1), IBITS,
       1                                        NLEVELS(I), AVB)
                                AVBTS(I) = AVBTS(I) + AVB * SUM(J)
                        END DO
                        AVBTS(I) = AVBTS(I) / TOT_SUM
                        AVBTS(NPARAM+1) = AVBTS(NPARAM+1) + AVBTS(I)
                        CALL HUFFMAN (SUM, LNG_NO_MRKV(IOFF1+1), IBITS,
       1                                NLEVELS(I), AVBTS_NO_MRKV(I))
                        AVBTS_NO_MRKV(NPARAM+1) = AVBTS_NO_MRKV(NPARAM+1) +
       1                                        AVBTS_NO_MRKV(I)
                        IOFF = IOFF + NLEVELS(I)**2
                        IOFF1 = IOFF1 + NLEVELS(I)
                END DO
        END IF

RETURN
        END

SUBROUTINE HUFFMAN (PROB, NBTS, IBITS, IDIM, AVBTS)
C
C***********************************************************************
C       Subroutine which computes the codewords for the
C       IDIM letters with probabilities PROB, when Huffman coding is
C       used. IBITS contains the codewords, NBTS contains the lengths
C       of the codewords, and AVBTS
C       is the average length based on the input distribution.
C
C       PROB:   (R*4) array with probabilities or relative frequencies.
C       NBTS:   (I*2) array with the corresponding codeword lengths.
C       IBITS:  (I*2) array with the codewords concatenated.
C       IDIM:   (I*2) dimension of PROB and NBTS.
C       AVBTS:  (R*4) average number of bits used.
C***********************************************************************
C
```

```
      INTEGER*2 IDIM
      INTEGER*2 NBTS(1), IBITS(1)
      INTEGER*2 IIN(256), IP(256), ID(256,256)

DIMENSION PROB(1)
      DIMENSION PIN(256)

IF (IDIM.GT.256 .OR. IDIM.LE.1) STOP 'NUMBER OF POINTS IN HUFFMAN'
      CALL DOUBLE (PROB(1), PIN(1), 2*IDIM)

! Merge probabilities, keep track of merges, and count bits per word

DO I = 1, IDIM
              IIN(I) = I      ! array to be ordered according to probabil.
              IP(I) = I       ! pointer frm each letter to last merge
              NBTS(I) = 0
      END DO
      DO L = 1, IDIM-1
              CALL BFRS (PIN, 1, IDIM, 1, IIN)
              ITEMP = IP(IIN(2))
              DO I = 1, IDIM
                      IF (IP(I) .EQ. IP(IIN(1))) THEN
                              NBTS(I) = NBTS(I) + 1
                              ID(NBTS(I), I) = 0
                      ELSE IF (IP(I) .EQ. ITEMP) THEN
                              NBTS(I) = NBTS(I) + 1
                              ID(NBTS(I), I) = 1
                              IP(I) = IP(IIN(1)) ! reorient pointer
                      END IF
              END DO
              PIN(1) = PIN(1) + PIN(2)
              PIN(2) = 1E20
      END DO ! Output codewrds with bits in reverse order ICOUNT = 0
      DO I = 1, IDIM
              DO J = 1, NBTS(I)
                      IBITS(ICOUNT+J) = ID(NBTS(I)-J+1,I)
              END DO
              ICOUNT = ICOUNT + NBTS(I)
      END DO
! Average codeword length AVBTS = 0
      SUM = 0
      DO I = 1, IDIM
              AVBTS = AVBTS + PROB(I) * NBTS(I)
              SUM = SUM + PROB(I)
      END DO
      IF (SUM .EQ. 0.) SUM = 1.
      AVBTS = AVBTS / SUM

RETURN
      END
```

What is claimed is:

1. A method of encoding digital speech information to characterize spoken human speech with an optimally reduced speech data rate while retaining speech quality in the audible reproduction of the encoded digital speech information, said method comprising:

storing digital speech information as digital speech data in the form of quantized speech parameter values comprising a plurality of speech data frames;

determining the transition probabilities for corresponding quantized speech parameter values in the next successive speech data frame in relation to the current speech data frame;

establishing the conditional probabilities as to the quantization values of the speech parameters of successive speech data frames based upon the determination of the transition probabilities; and representing the respective quantization values of the speech parameters after the conditional probabilities have been established by a digital code wherein digital codewords of variable length represent quantization values in accordance with their probability of occurrence such that more probable quantization values are assigned digital codewords of a shorter bit length while less probable quantization values are assigned digital codewords of a longer bit length.

2. A method of encoding digital speech information as set forth in claim 1, further including
representing the quantized speech parameter values by finite state machines having predetermined matrices of columns and rows of transitional probabilities prior to the determination of the transition probabilities for the corresponding quantized speech parameter values of the current and at least the next successive speech data frame.

3. A method of encoding digital speech information as set forth in claim 2, wherein the respective quantization values of the speech parameters are represented by a digital code as applied to all of the rows of the transitional probabilities matrix corresponding thereto.

4. A method of encoding digital speech information as set forth in claim 3, wherein the digital codewords representing the respective quantization values of the speech parameters are of shorter bit lengths around the diagonal of the transitional probabilities matrix corresponding thereto reflecting a higher probability of occurrence for a particular quantization value of the speech parameter.

5. A method of encoding digital speech information as set forth in claim 4, wherein the representation of the respective quantization values of the speech parameters is accomplished by assigning a uniquely decodable digital codeword which is distinct from the first part of any other digital codeword for each of the quantization values included in a transitional probabilities matrix.

6. A method of encoding digital spech information as set forth in claim 2, further including
combining transitional probabilities matrices of the same dimensions to provide a supermatrix from which the transitional probabilities are determined, and
representing the respective quantization values of the speech parameters from the combined transitional probabilities matrices by digital codewords based upon said supermatrix.

7. A method of encoding digital speech information as set forth in claim 6, wherein the combining of transitional probabilities matrices is accomplished for every set of matrices $[j_1, \ldots, j_m]$ having the same dimensions to provide said supermatrix in accordance with $$n(s, i/k) = \sum_{r=1}^{m} n(j_r, i/k)$$

where s is the supermatrix, and
n(j,i/k) is the number of transitions occurring in a reference speech data base from which the transitional probabilities matrices are determined.

8. A method of encoding digital speech information as set forth in claim 2, further including
condensing each of the predetermined matrices of columns and rows of transitional probabilities to a single super row of transitional probabilities indicative of the respective matrix corresponding thereto; and
shifting said super row of transitional probabilities in increments of one position in either direction to generate the conditional probability distribution of additional rows of transitional probabilities for the specific matrix corresponding to said super row.

9. A method of encoding digital speech information as set forth in claim 8, wherein said super row is based upon the middle row $2^{b(j)-1}$ of the matrix of transitional probabilities of which it is indicative and has absolute frequencies of occurrence n(j,i) in accordance with $$n(j, i) = \sum_{K=-2^{b(j)-1}}^{2^{b(j)-1}-1} n(j, (i-k)/(2^{b(j)-1} - k))$$

where $n(j,i/i_1)=0$ for $i \leq 0$ or $i \leq 2^{b(j)}$.

10. A speech encoding system for providing encoded digital speech information in a form producing an optimally reduced speech data rate while retaining speech quality in the subsequent audible reproduction of the encoded digital speech information, said system comprising:
first memory means storing a plurality of digital codewords representative of the respective quantization values to be attributed to speech parameters as derived from finite state machines having predetermined matrices of columns and rows of transitional probabilities representative of the quantized speech parameter values wherein the digital codewords corresponding to a given predetermined matrix are of variable bit lengths in accordance with the probability of occurrence of a given quantization value such that more probable quantization values are represented by digital codewords of a shorter bit length while less probable quantization values are represented by digital codewords of a longer bit length;
second memory means having a storage capacity sufficient to accept at least a single frame of digital speech data wherein the digital speech parameters included in said frames of speech data are in quantized form; and being adapted to receive respective frames of digital speech data from a source thereof;
coding means for encoding frames of digital speech data wherein the digital speech parameters thereof are in quantized form, said coding means being operably coupled to said first and second memory means and to a source of digital speech data in quantized form; and
said coding means being responsive to a current frame of digital speech data as input thereto and to at least a single previous frame of digital speech data from said second memory means to access the appropriate digital codewords from said first memory means for assigning a digital codeword from said first memory means to each of the quantized speech parameters included in the current frame of digital speech data as the output therefrom.

11. A speech encoding system as set forth in claim 10, wherein the source of digital speech data in quantized form comprises linear predictive coded digital speech parameters;
the output of said coding means producing digital codewords corresponding to each of the linear predictive coding quantized speech parameters of the current frame of digital speech data but having a reduced bit length as compared thereto.

12. A speech encoding system as set forth in claim 11, further including analyzer means for receiving an analog speech signal representative or oral speech and providing digital speech information indicative thereof in the form of one or more digital speech frames made oup of individual digital speech parameters; and quantizer means for receiving said one or more digital speech frames from said analyzer means and quantizing the speech parameters thereof.

13. A speech encoding system as set forth in claim 10, wherein the plurality of digital codewords stored in said first memory means are derived from combined transitional probabilities matrices of the same dimensions so as to define respective supermatrices on which the plurality of digital codewords are based.

14. A speech encoding system as set forth in claim 13, wherein said plurality of digital codewords stored in said first memory means are derived for every set of matrices $[j_1, \ldots, j_m]$ having the same dimensions to provide said supermatrix in accordance with $$n(s, i/k) = \sum_{r=1}^{m} n(j_r, i/k)$$

where s is the super matrix, and
n(j, i/k) is the number of transitions occurring in a reference speech data base from which the transitional probabilities matrices were originally determined.

15. A speech encoding system as set forth in claim 10, wherein said plurality of digital codewords stored in said first memory means are derived from respective single super rows of transitional probabilities indicative of each of the predetermined matrices of columns and rows of transitional probabilities; and
said coding means including means therein for shifting an accessed super row of transitional probabilities to which digital codewords are assigned in increments of one position in either direction to generate the complete series of digital codewords corresponding to the specific matrix upon which said super row is based.

16. A speech encoding system as set forth in claim 15, wherein said super row is based upon the middle row $2^{b(j)-1}$ of the matrix of transitional probabilities of which it is indicative and has absolute frequencies of occurrence n(j, i) in accordance with $$n(j, i) = \sum_{K=-2^{b(j)-1}}^{2^{b(j)-1}-1} n(j, (i-k)/(2^{b(j)-1} - k))$$

where $n(j, i/i_1)$ equals 0 for $i \leq 0$ or $i > 2^{b(j)}$.

17. A speech synthesis system for producing audible synthesized speech at a reduced bit rate from encoded digital speech information, said speech synthesis system comprising:
a source of digital speech information identified as one or more frames of encoded digital speech data having speech parameters defining the respective digital speech frames, wherein each of the speech parameters is represented by a respective digital codeword representative of the quantization value thereof, the digital codewords being derived from finite state machines having predetermined matrices of columns and rows of transitional probabilities representative of the quantized speech parameter values wherein the digital codewords correspond to a given predetermined matrix and are of variable bit lengths in accordance with the probability of occurrence of a given quantization value such that more probable quantization values are represented by digital codewords of a shorter bit length while less probable quantization values are represented by digital codewords of a longer bit length;
first memory means storing a plurality of digital code words representative of speech parameters, wherein each speech parameter in successive speech frames is identified by a codeword of a constant bit length and serving as an address identifying a digital speech parameter of a fixed bit number length;
second memory means having a storage capacity sufficient to accept at least a single frame of digital speech data wherein the digital speech parameters included in said frame of speech data are defined by digital codewords of a constant bit length for respective parameters in successive digital speech frames;
decoding means for decoding frames of digital speech data and being operably coupled to said source of encoded speech data and said first and second memory means, said decoding means being responsive to a current frame of digital speech data as input thereto and to at least a single previous decoded frame of digital speech data from said second memory means to access the appropriate digital codewords of constant bit length for respective speech parameters from said first memory means for assigning a digital codeword from said first memory means to each of said speech parameters included in the current frame of encoded digital speech data as the output therefrom;
parameter memory means connected to the output of said decoder means and having a plurality of digital speech parameter values stored therein identifiable by respective digital codewords from said first memory means and responsive to the output from said decoder means for providing decoded digital speech parameters of a constant bit length greater than the bit lengths of the respective digital codewords included in said first memory means as an output therefrom;
speech synthesizer means connected to said parameter memory means for receiving the decoded digital speech parameters therefrom and providing an analog speech signal representative of synthesized human speech as an output in response thereto; and
audio means coupled to the output of said speech synthesizer means for converting said analog speech signal representative of synthesized human speech into audible speech.

18. A speech synthesis system as set forth in claim 17, wherein the digital codewords stored in said first memory means are based upon linear predictive coding, and said speech synthesizer means is a linear predictive coding speech synthesizer.

* * * * *